(12) United States Patent
Liang et al.

(10) Patent No.: US 10,607,703 B2
(45) Date of Patent: Mar. 31, 2020

(54) SPLIT-GATE FLASH MEMORY ARRAY WITH BYTE ERASE OPERATION

(71) Applicant: Silicon Storage Technology, Inc., San Jose, CA (US)

(72) Inventors: Hsuan Liang, Hsinchu (TW); Jeng-Wei Yang, Zhubei (TW); Man-Tang Wu, Xinpu Township, Hsinchu County (TW); Nhan Do, Saratoga, CA (US); Hieu Van Tran, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/042,000

(22) Filed: Jul. 23, 2018

(65) Prior Publication Data

US 2019/0355424 A1 Nov. 21, 2019

Related U.S. Application Data

(60) Provisional application No. 62/673,633, filed on May 18, 2018, provisional application No. 62/672,124, filed on May 16, 2018.

(51) Int. Cl.
*G11C 16/16* (2006.01)
*G11C 16/04* (2006.01)
*H01L 27/11521* (2017.01)

(52) U.S. Cl.
CPC .......... *G11C 16/16* (2013.01); *G11C 16/0425* (2013.01); *H01L 27/11521* (2013.01)

(58) Field of Classification Search
CPC G11C 16/16; G11C 16/0425; H01L 27/11521
USPC ...................................... 365/185.33
See application file for complete search history.

(56) References Cited

U.S. PATENT DOCUMENTS

| 5,029,130 | A | 7/1991 | Yeh |
| 7,608,882 | B2 | 10/2009 | Lung |
| 9,286,982 | B2 | 3/2016 | Tran et al. |
| 2002/0176286 | A1 | 11/2002 | Bergemont |
| 2003/0206455 | A1 | 11/2003 | Hsu |
| 2007/0047302 | A1* | 3/2007 | Lee ............. G11C 16/0408 365/185.05 |
| 2009/0279361 | A1* | 11/2009 | Lojek ............. G11C 16/0433 365/185.18 |

(Continued)

*Primary Examiner* — Fernando Hidalgo
(74) *Attorney, Agent, or Firm* — DLA Piper LLP (US)

(57) ABSTRACT

A memory device with memory cells in rows and columns, word lines connecting together the control gates for the memory cell rows, bit lines electrically connecting together the drain regions for the memory cell columns, first sub source lines each electrically connecting together the source regions in one of the memory cell rows and in a first plurality of memory cell columns, second sub source lines each electrically connecting together the source regions in one of the memory cell rows and in a second plurality of memory cell columns, first and second source lines, first select transistors each connected between one of first sub source lines and the first source line, second select transistors each connected between one of second sub source lines and the second source line, and select transistor lines each connected to gates of one of the first select transistors and one of the second select transistors.

15 Claims, 32 Drawing Sheets

(56) References Cited

U.S. PATENT DOCUMENTS

2016/0042790 A1\* 2/2016 Tran ...................... G11C 16/16
                                                    365/185.29

\* cited by examiner

SPLIT-GATE FLASH MEMORY ARRAY WITH BYTE ERASE OPERATION

RELATED APPLICATIONS

This application claims the benefit of U.S. Provisional Application No. 62/672,124 filed on May 16, 2018, and U.S. Provisional Application No. 62/673,633 filed on May 18, 2018, which are incorporated herein by reference.

FIELD OF THE INVENTION

The present invention relates to non-volatile memory arrays.

BACKGROUND OF THE INVENTION

Split gate non-volatile memory cells, and arrays of such cells, are well known. For example, U.S. Pat. No. 5,029,130 ("the '130 patent") discloses an array of split gate non-volatile memory cells. The memory cell is shown in FIG. 1. Each memory cell 10 includes source and drain regions 14/16 formed in a semiconductor substrate 12, with a channel region 18 there between. A floating gate 20 is formed over and insulated from (and controls the conductivity of) a first portion of the channel region 18, and over a portion of the drain region 16. A control gate 22 has a first portion 22a that is disposed over and insulated from (and controls the conductivity of) a second portion of the channel region 18, and a second portion 22b that extends up and over the floating gate 20. The floating gate 20 and control gate 22 are insulated from the substrate 12 by a gate oxide 26.

The memory cell is erased (where electrons are removed from the floating gate) by placing a high positive voltage on the control gate 22, which causes electrons on the floating gate 20 to tunnel through the intermediate insulation 24 from the floating gate 20 to the control gate 22 via Fowler-Nordheim tunneling.

The memory cell is programmed (where electrons are placed on the floating gate) by placing a positive voltage on the control gate 22, and a positive voltage on the drain 16. Electron current will flow from the source 14 towards the drain 16. The electrons will accelerate and become heated when they reach the gap between the control gate 22 and the floating gate 20. Some of the heated electrons will be injected through the gate oxide 26 onto the floating gate 20 due to the attractive electrostatic force from the floating gate 20. This technique is often referred to as hot electron injection.

The memory cell is read by placing positive read voltages on the drain 16 and control gate 22 (which turns on the channel region under the control gate). If the floating gate 20 is positively charged (i.e. erased of electrons and positively coupled to the drain 16), then there is sufficient capacitive coupling from the control gate 22 to the floating gate 20 to turn on the portion of the channel region under the floating gate 20, and current will flow across the channel region 18, which is sensed as the erased or "1" state. If the floating gate 20 is negatively charged (i.e. programmed with electrons), then the capacitive coupling from the control gate 22 to the floating gate 20 is insufficient to turn on the portion of the channel region under the floating gate 20 which will remain mostly or entirely turned off, and current will not flow (or there will be little flow) across the channel region 18, which is sensed as the programmed or "0" state. Those skilled in the art understand that the terms source and drain can be interchangeable, where the region partially underneath the floating gate can referred to as the source region 14, and the region adjacent the control gate is referred to as the drain region 16, as shown in FIG. 2. FIG. 2 also shows how pairs of memory cells can be formed sharing a single source region 14. Two adjacent pairs of memory cells can be arranged end to end and share a single drain region 16.

FIG. 3 illustrates a conventional array configuration of memory cells 10. The memory cells 10 are arranged in rows and columns. Each column includes pairs of memory cells that are arranged end to end. Each column is commonly referred to as an active region, and adjacent active regions are insulated from each other by insulation material formed in what is commonly referred to as an isolation region. Each row of memory cells includes a word line WL that electrically connects together all the control gates 22 for that row of memory cells. Preferably, the control gates are formed contiguously across the entire row, and constitute the word line WL (i.e. the control gate for each memory cell is that portion of the word line WL that disposed over that memory cell's channel region). Each row of memory cell pairs includes a source line SL that electrically connects together all the source regions 14 for that row of memory cell pairs. The source line can be a continuous diffusion region extending across the active/isolation regions, or can include a separate conductive line that includes periodic contacts to the source regions. Each column of memory cells includes a bit line BL that electrically connects together all of the drain regions 16 for that column of memory cells.

FIG. 3 shows an array of four rows and four columns, with four word lines WL0-WL3, four bit lines BL0-BL3 and two source lines SL0-SL1. However, it should be understood that a memory array having such an architecture would likely include at least hundreds or thousands of rows and columns.

As detailed above, memory cells are erased by placing a high voltage on the control gate. Thus, an entire row of memory cells is erased at one time by applying a high voltage to the row's word line. One limitation of this architecture is that if there is a need to change information stored in just a portion of the row, such as single byte of information, the entire row would have to erased and reprogrammed. There is no ability to erase just a portion of one row of the memory cells.

There is a need for a memory array architecture that allows for selective erasure of just a portion of a row of memory cells.

BRIEF SUMMARY OF THE INVENTION

The aforementioned problems and needs are addressed by a memory device that includes a plurality of memory cells configured in rows and columns on a semiconductor substrate. Each of the memory cells includes source and drain regions formed in the substrate and defining a channel region of the substrate extending there between, a floating gate disposed over and insulated from a first portion of the channel region, and a control gate disposed over and insulated from a second portion of the channel region. The memory device further includes a plurality of word lines each electrically connecting together the control gates for one of the rows of the memory cells, a plurality of bit lines each electrically connecting together the drain regions for one of the columns of the memory cells, a plurality of first sub source lines each electrically connecting together the source regions of the memory cells that are in one of the rows of the memory cells and are in a first plurality of the columns of the memory cells, a plurality of second sub source lines each electrically connecting together the source regions of the memory cells that are in one of the rows of the memory cells and are in a second plurality of the columns of the memory cells, wherein the first plurality of the columns is different from the second plurality of the columns, a first source line and a second source line, a plurality of first select transistors each connected between one of first sub source lines and the first source line, a plurality of second select transistors each connected between one of second sub source lines and the second source line, and a plurality of select transistor lines each connected to a gate of one of the first select transistors and a gate of one of the second select transistors.

The memory device can include a plurality of memory cells configured in rows and columns on a semiconductor substrate, wherein each of the memory cells includes source and drain regions formed in the substrate and defining a channel region of the substrate extending there between, a floating gate disposed over and insulated from a first portion of the channel region, and a control gate disposed over and insulated from a second portion of the channel region. The memory device further includes a plurality of word lines each electrically connecting together the control gates for one of the rows of the memory cells, a plurality of bit lines each electrically connecting together the drain regions for one of the columns of the memory cells, a plurality of first sub source lines each electrically connecting together the source regions of the memory cells that are in one of the rows of the memory cells and are in a first plurality of the columns of the memory cells, a plurality of second sub source lines each electrically connecting together the source regions of the memory cells that are in one of the rows of the memory cells and are in a second plurality of the columns of the memory cells, wherein the first plurality of the columns is different from the second plurality of the columns, a plurality of source lines, a plurality of first select transistors each connected between one of first sub source lines and one of the source lines, a plurality of second select transistors each connected between one of second sub source lines and one of the source lines, a first select transistor line connected to gates of the first select transistors, and a second select transistor line connected to gates of the second select transistors.

Other objects and features of the present invention will become apparent by a review of the specification, claims and appended figures.

DETAILED DESCRIPTION OF THE INVENTION

Figure 3:
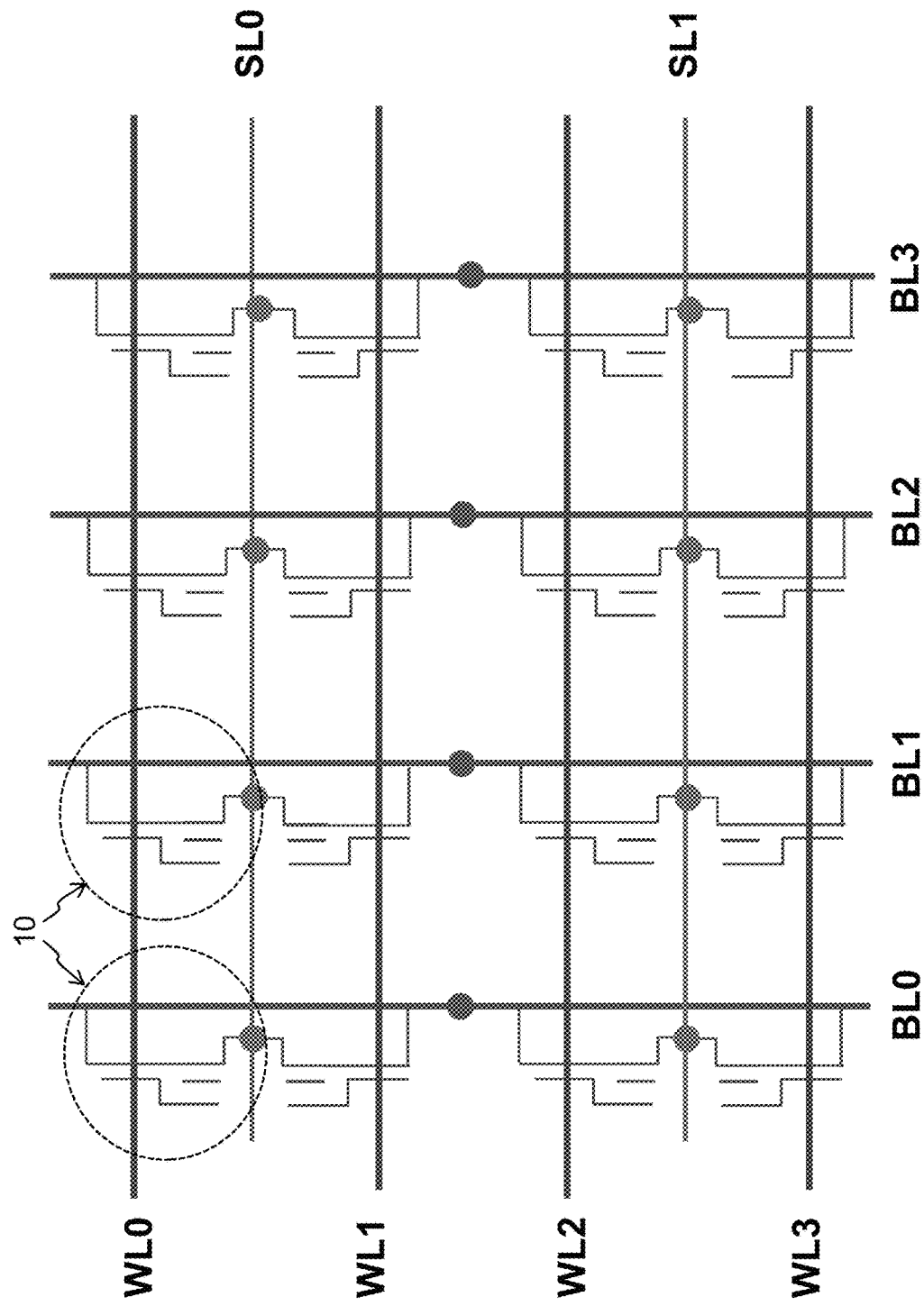
FIG. 3 is a diagram showing a conventional memory array architecture.
Figure 4:
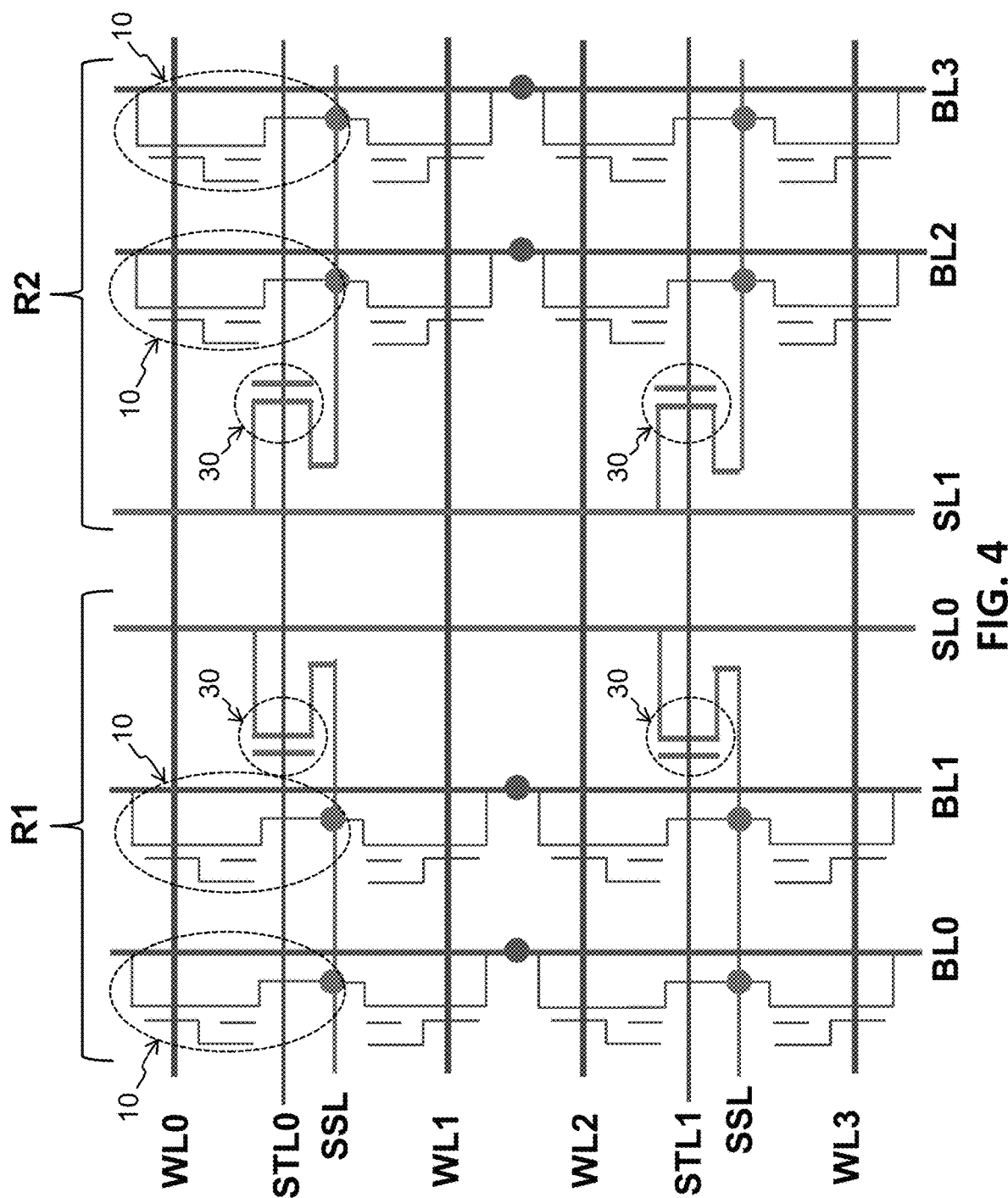
FIG. 4 is a diagram showing a first embodiment of a memory array architecture.

The present invention is an array architecture that provides the ability to erase just a portion of the row of memory cells. FIG. 4 illustrates a first embodiment, which is similar the architecture of FIG. 3. However, instead of having a source line extending along the entire length of a row, each row of memory cell pairs includes a plurality of sub source lines SSL, where each sub source line SSL only extends across and electrically connects together a subset of the source regions for each row of memory cell pairs (i.e., a subrow of memory cell pairs). Specifically, the rows of memory cells are divided up into regions R (i.e., distinct pluralities of the columns of the memory cells), where the sub source lines SSL each only extend across and electrically connect together the source regions for that portion of the row of memory cell pairs inside of the one region R. FIG. 4 shows two regions R1 and R2, with each region being two memory cells wide (i.e., two columns wide, with each subrow of memory cells includes two memory cells, and therefore each subrow of memory cell pairs includes four memory cells). However, the number of regions R and their widths (i.e., the number of columns of memory cell in the region R) can vary. For example, each subrow of memory cells within a region R can include enough memory cells to store one byte (8 bits) of data. Alternatively, the subrow of memory cells within a region R can include enough memory cells to store one word of data (16 or 32 bits).

Each subrow of memory cell pairs within any given region R has its own sub source line SSL. Therefore, each region R has its own set of sub source lines SSL. Each region R also has its own vertically extending source line SL (i.e., extending in the column direction). Each sub source line SSL is connected to its source line SL by a select transistor 30 (i.e., the source/drain channel path of the select transistor is connected between the source line SSL and source line SL). Each row of select transistors 30 is operated by a select transistor line STL (i.e., the select transistor line STL is connected to the gates of the transistors) that is used to activate (i.e., make the source/drain channel paths conductive to electrically connect the SSLs to the STL's) or deactivate (i.e. make the source/drain channel paths nonconductive to electrically disconnect the SSL's from the STL's) the row of select transistors 30 connected thereto. The transistors are activated by applying a voltage on the select transistor line STL that exceeds the threshold voltage of the transistors. The transistors are deactivated by applying no or zero voltage or a low voltage below the threshold voltage of the transistors.

Figure 5:
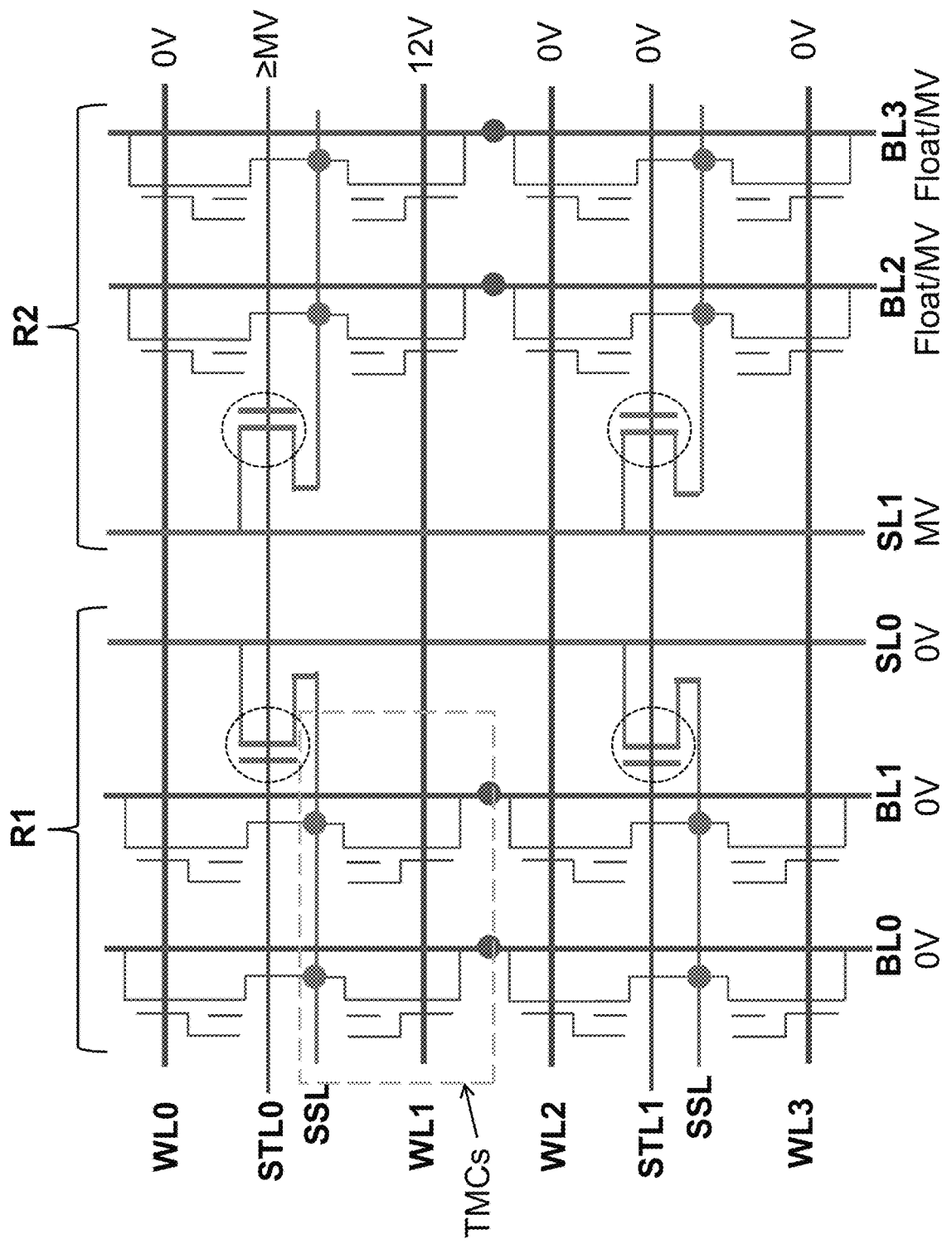
FIG. 5 is a diagram showing exemplary erase operation voltages for the first embodiment of a memory array architecture.

The above described array configuration allows for a single subrow of memory cells to be erased, without disturbing the programming state of any other memory cells in the rest of the row of memory cells, or any other memory cells in the memory array. FIG. 5 illustrates exemplary voltages that can be applied to erase just one of the subrows of memory cells. Specifically, in order to erase the memory cells on word line WL1 in region R1 (the target memory cells TMCs), 0V is applied to the bit lines for region R1, and a floating or positive voltage (e.g., MV) to the bit lines in other regions. A high positive voltage (e.g. 12V) is applied to word line WL1, and 0V applied to all the other word lines WL. A positive voltage (e.g., >MV, which is greater than the threshold voltage) is applied to the select transistor line STL0 for the row of memory cells being erased, sufficient to turn on the select transistors 30 for the first row of memory cell pairs (so that the voltages on the source lines SL are passed on to the sub source lines SSL for that row of memory cell pairs). A zero voltage (or other low voltage that is below the threshold voltage) is applied to the other select transistor lines (including STL1), so that the select transistors 30 on these lines are off, and specifically do not pass the voltage on source line SL1 to the sub source lines in region R2 for memory cells not on word line WL1. Finally, 0V is applied to source line SL0, with a positive voltage (e.g., MV) applied to the remaining source lines SL. These voltages result in the target memory cells TMCs in region R1 in the row corresponding to WL1 being erased (by the high positive voltage on word line WL1). The other memory cells in the same row are not erased because the positive voltage on the remaining source lines SL is applied to those memory cells through the activated select transistors 30 on select transistor line STL0. Specifically, positive voltages are applied to both the control gate and the source region for these memory cells, which will inhibit any erasure because the floating gate will see positive voltages on both opposing sides and thus no erasure will occur. The programming state of the remaining memory cells in region R2 are not adversely affected by the positive voltage on the source line SL1, because the select transistors 30 for those memory cells are not activated, and thus the voltage on source line SL1 does not reach the source regions of those memory cells. The programming state of the remaining memory cells in region R1 are not adversely affected because no positive voltages are applied to their word lines WL or source line SL0.

Figure 6:
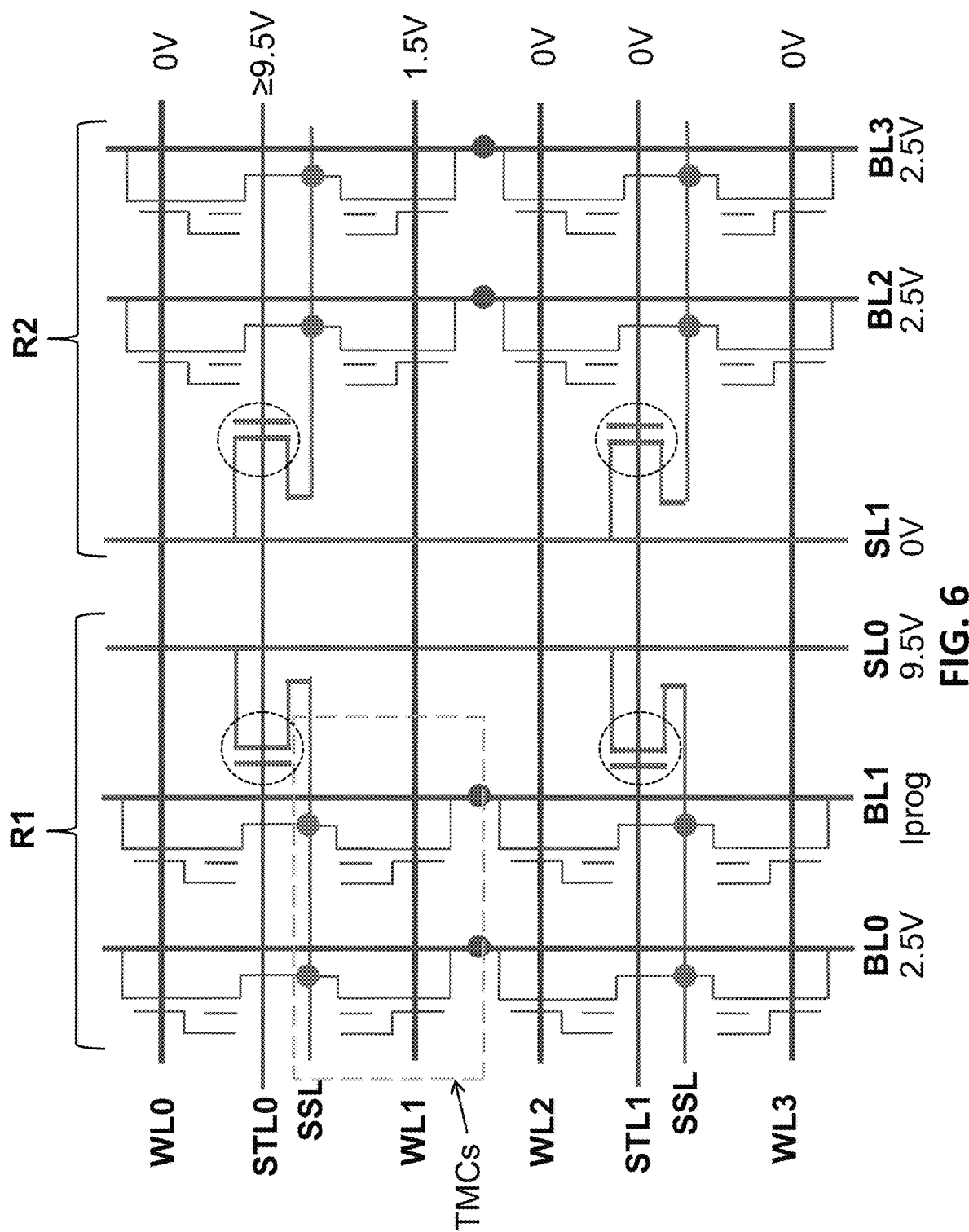
FIG. 6 is a diagram showing exemplary program operation voltages for the first embodiment of a memory array architecture.
Figure 7:
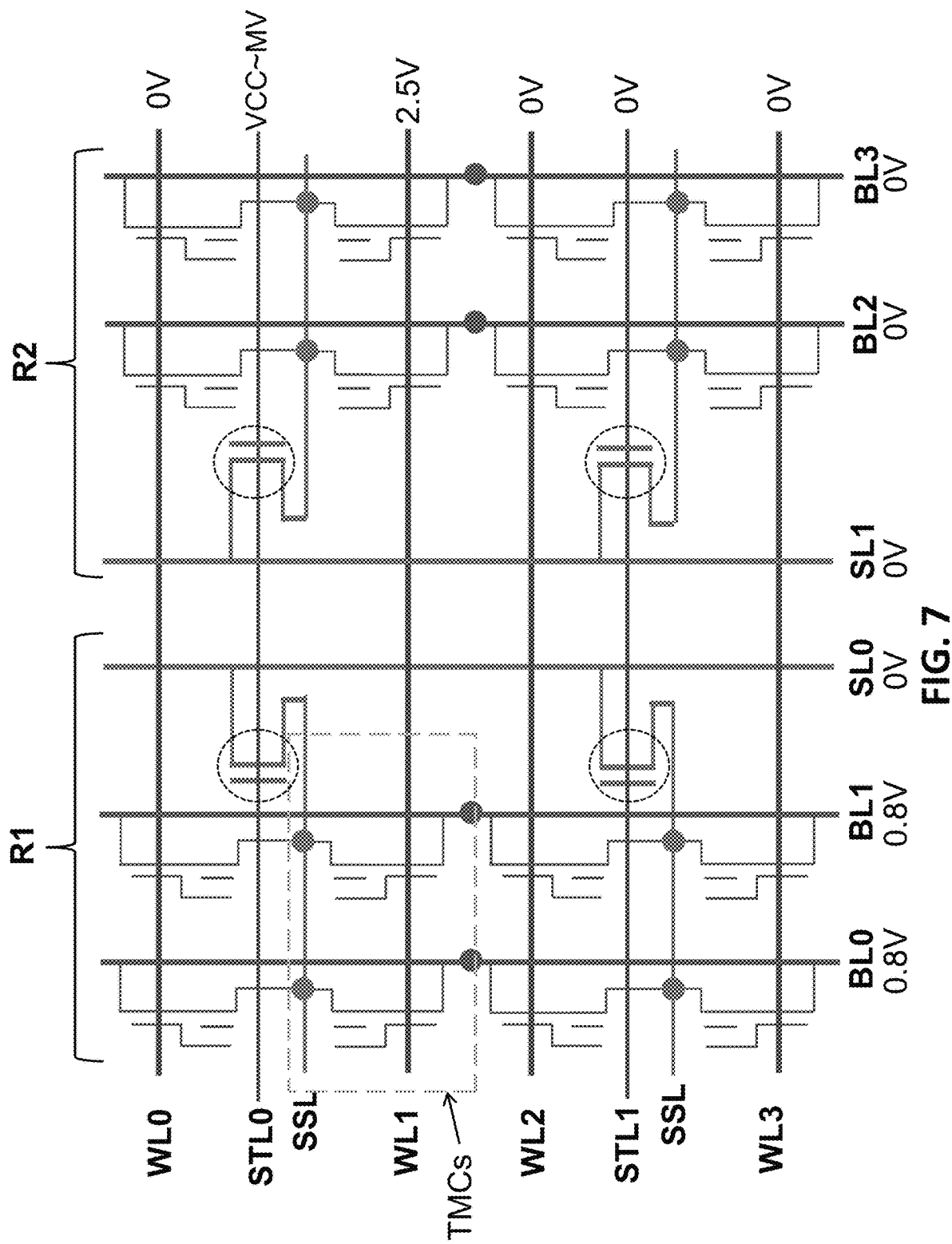
FIG. 7 is a diagram showing exemplary read operation voltages for the first embodiment of a memory array architecture.

FIG. 6 illustrates exemplary voltages for programming one of the target memory cells (right hand cell of the TMCs). Only the targeted cell receives the right combination of voltages necessary for programming by hot electron injection as described above. The other cells either do not have the requisite positive voltage on its word line WL, and/or the requisite voltages on their sub source lines and bit lines. FIG. 7 illustrates exemplary voltages for reading the target memory cells TMCs, which are the only cells that receive the requisite read voltage combination as described above on their word lines WL, sub source lines and/or bit lines.

Figure 8:
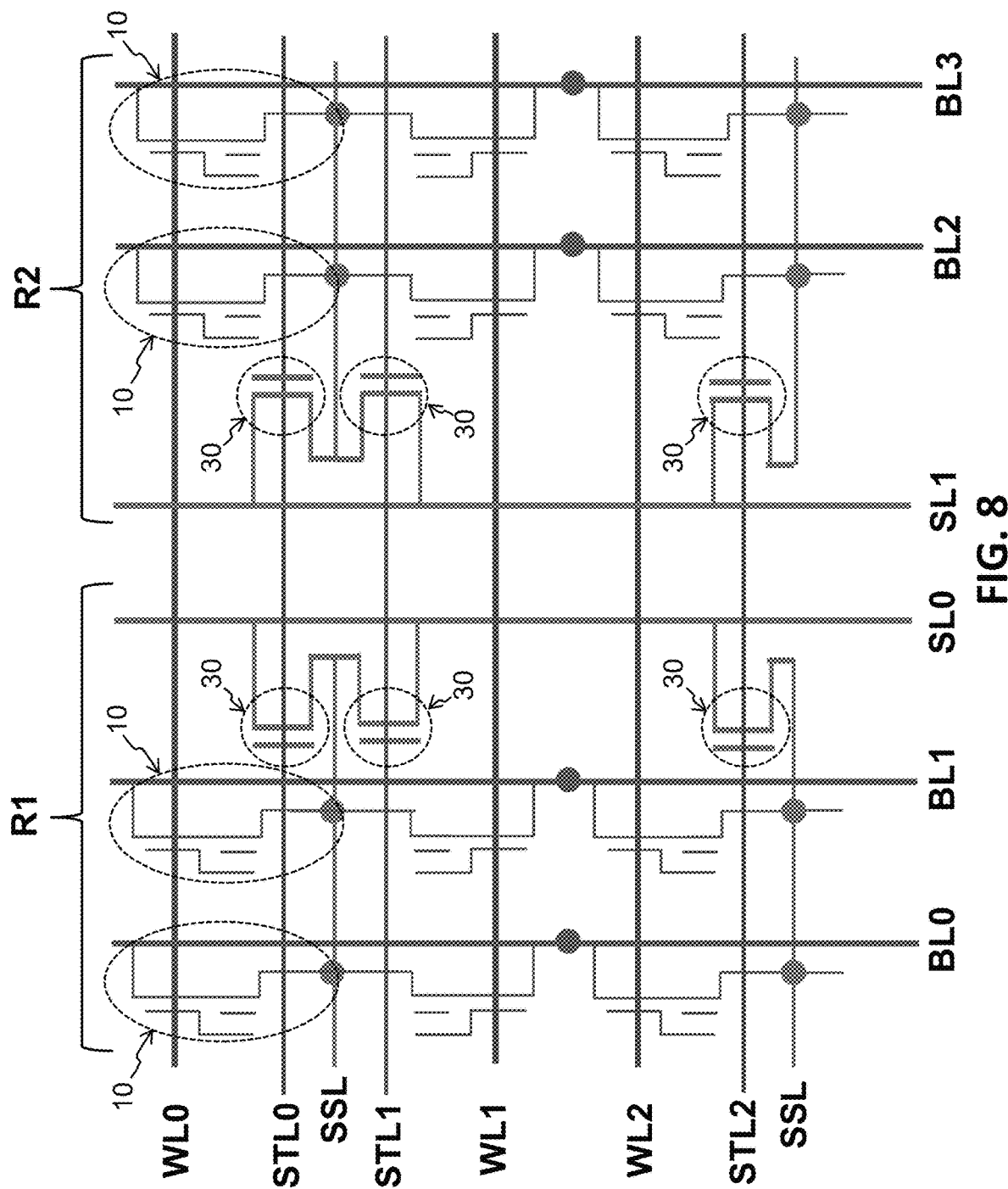
FIG. 8 is a diagram showing a second embodiment of a memory array architecture.
Figure 9:
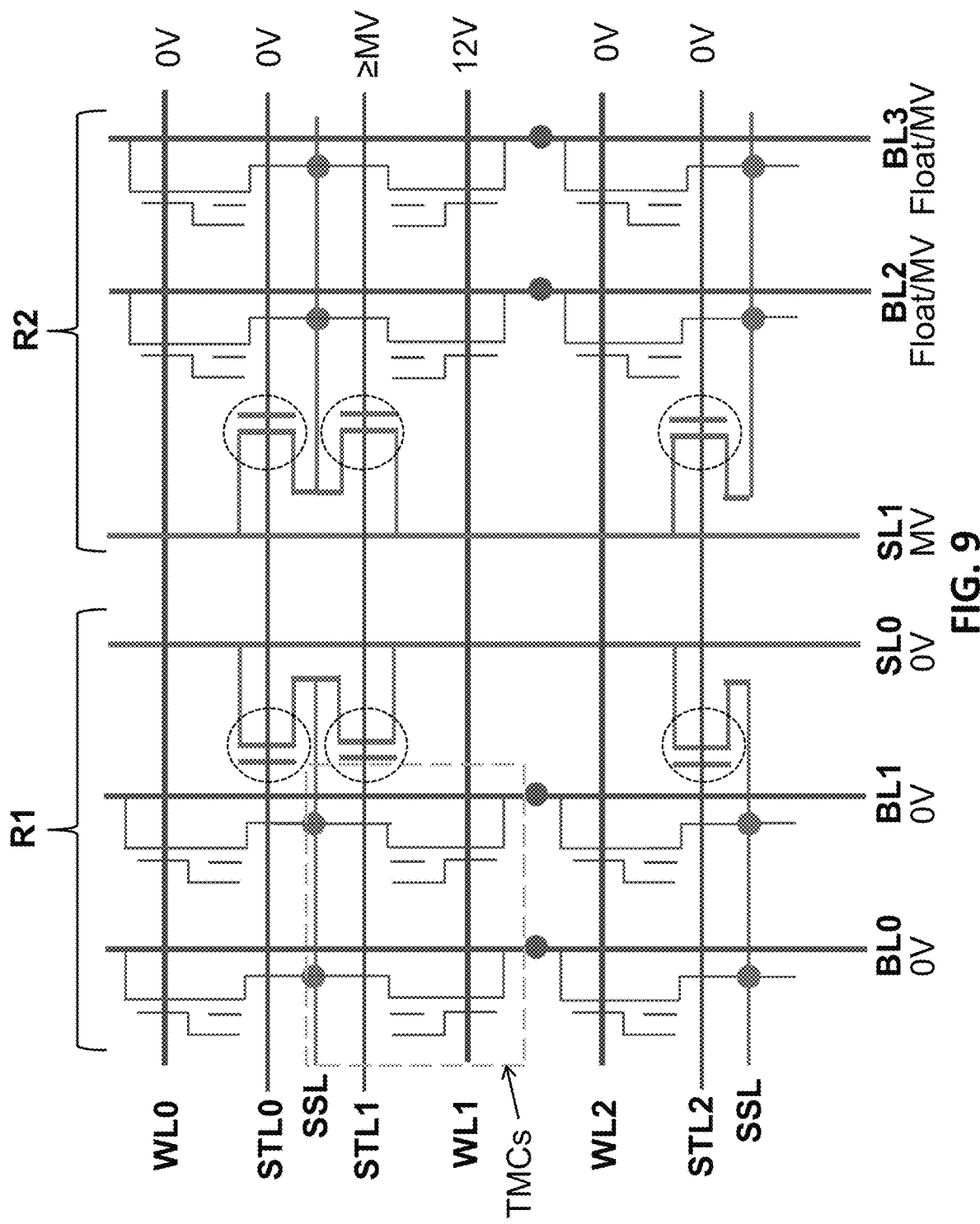
FIG. 9 is a diagram showing exemplary erase operation voltages for the second embodiment of a memory array architecture.
Figure 10:
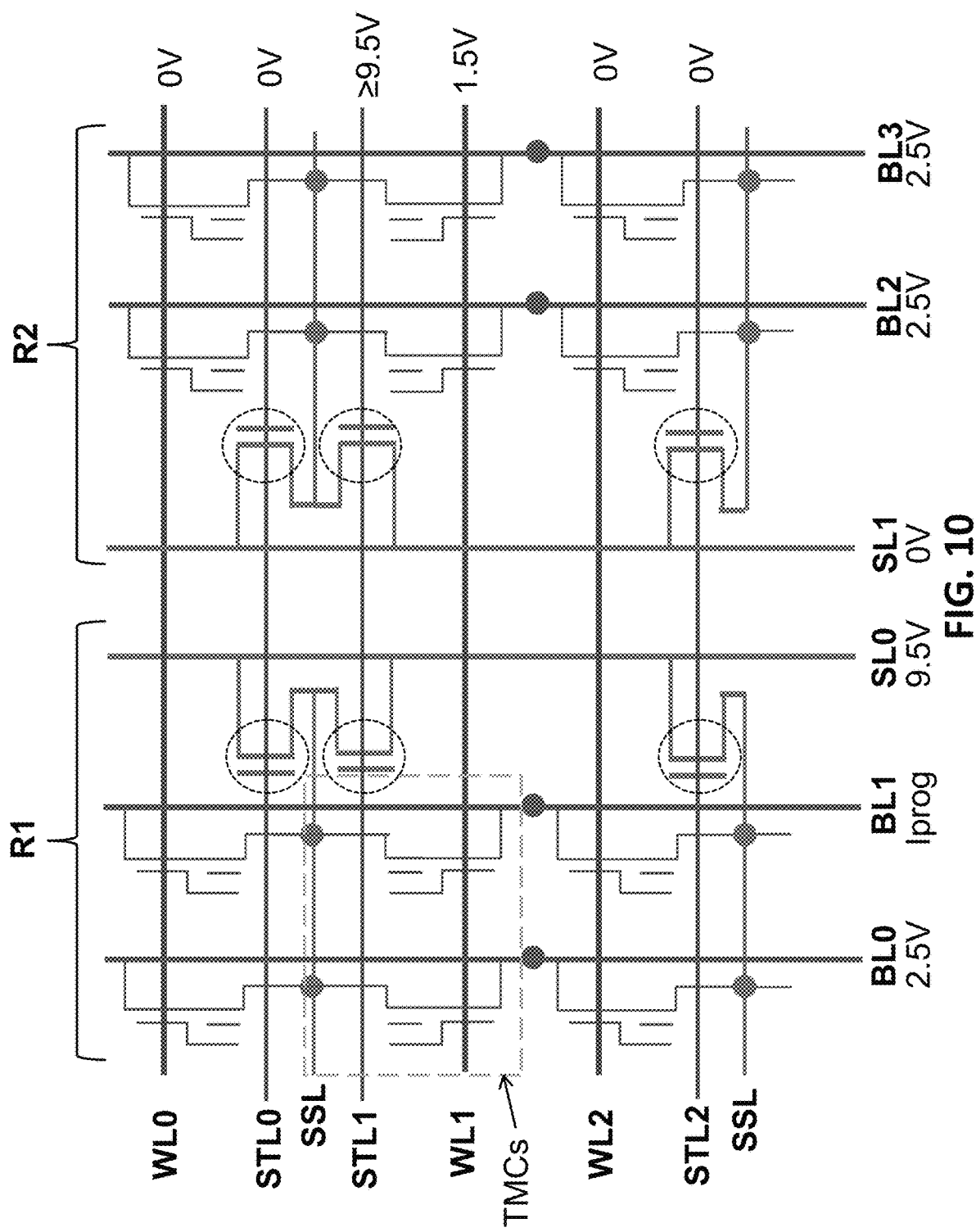
FIG. 10 is a diagram showing exemplary program operation voltages for the second embodiment of a memory array architecture.
Figure 11:
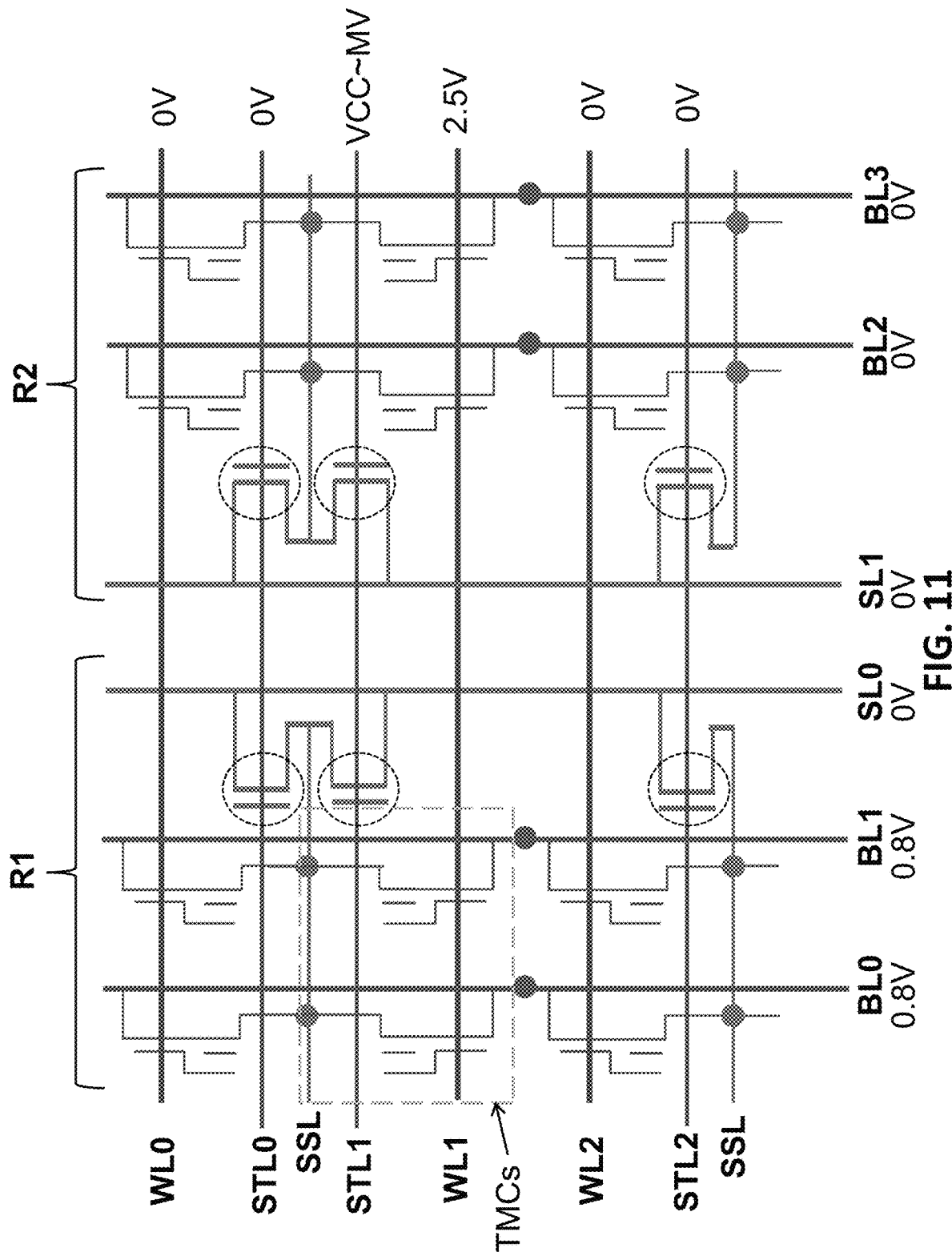
FIG. 11 is a diagram showing exemplary read operation voltages for the second embodiment of a memory array architecture.

FIGS. 8-11 illustrate a second embodiment, which is similar to the embodiment of FIGS. 4-7, except each sub source line SSL includes two select transistors 30 each of which can couple the associated source line SL to the sub source lines SSL, as shown in FIG. 8. This configuration is advantageous because it provides two select transistors for driving each sub source line for greater driving current on each sub source line. FIG. 9 illustrates exemplary voltages for erasing all the memory cells on word line WL1 in region R1 (i.e., TMCs, because only those cells are subjected to a high word line voltage without a countering positive source line voltage). FIG. 10 illustrates exemplary voltages for programming one of the memory cells (right hand cell of the TMCs), and FIG. 11 illustrates exemplary voltages for reading the target memory cells TMCs.

Figure 12:
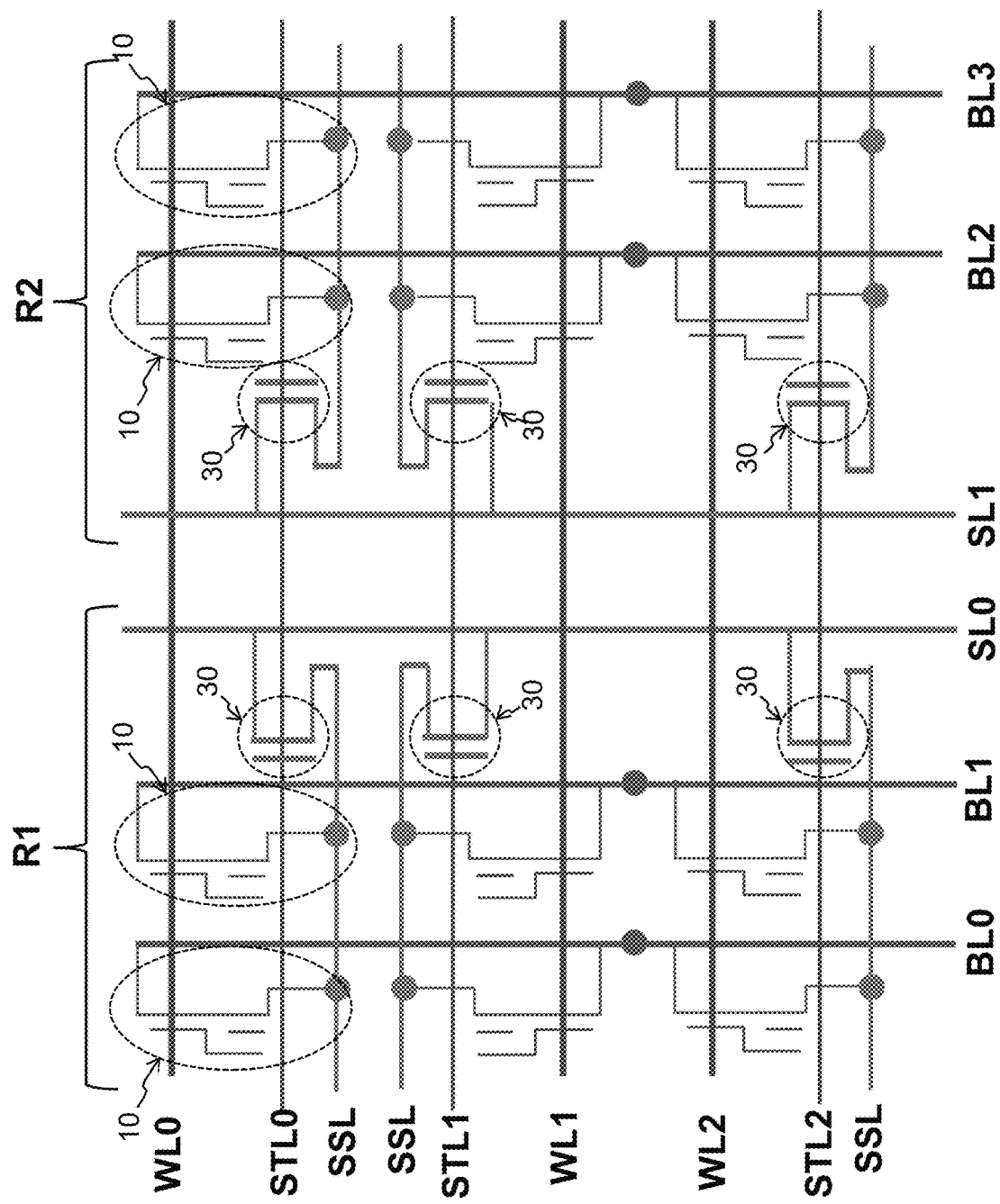
FIG. 12 is a diagram showing a third embodiment of a memory array architecture.
Figure 13:
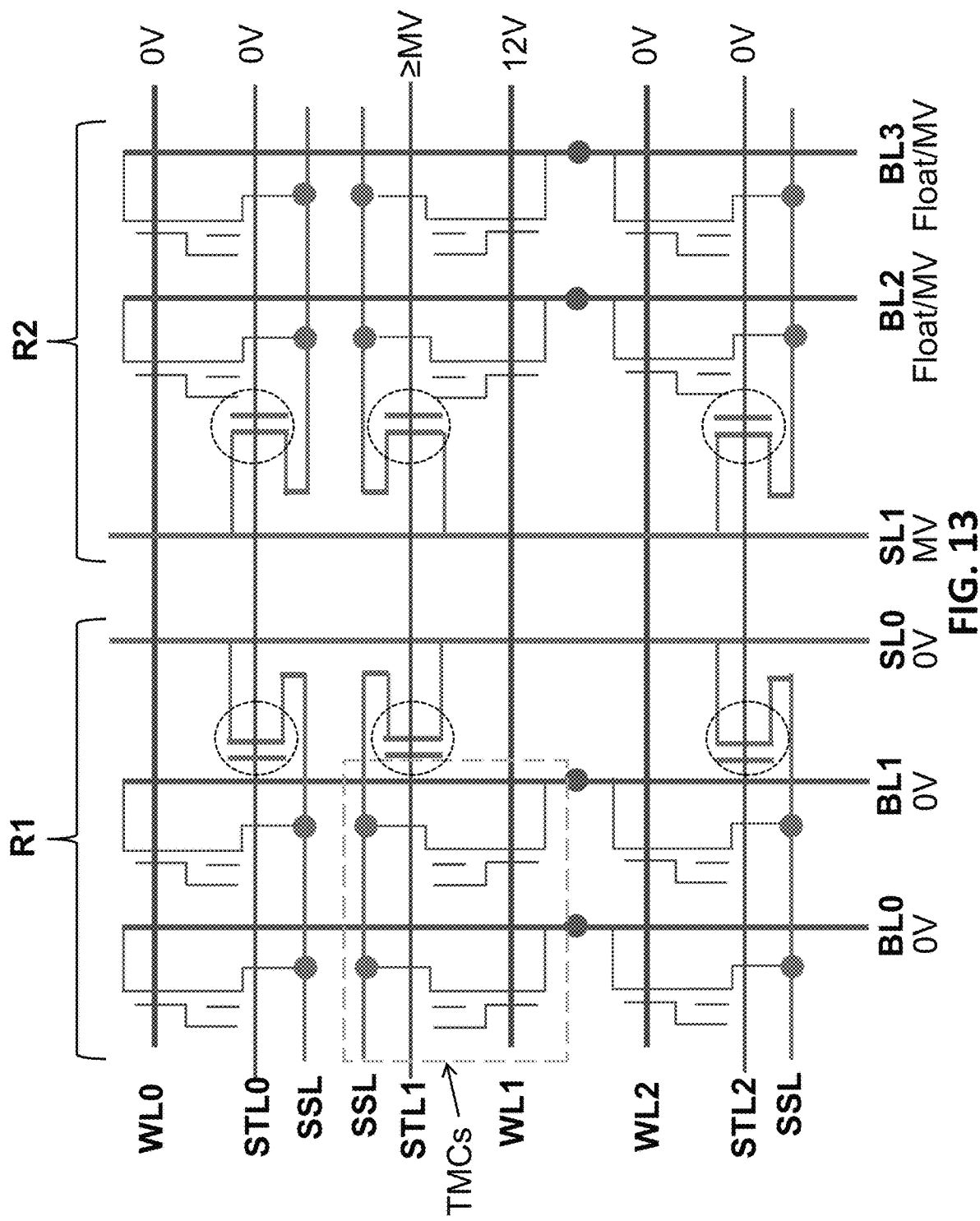
FIG. 13 is a diagram showing exemplary erase operation voltages for the third embodiment of a memory array architecture.
Figure 14:
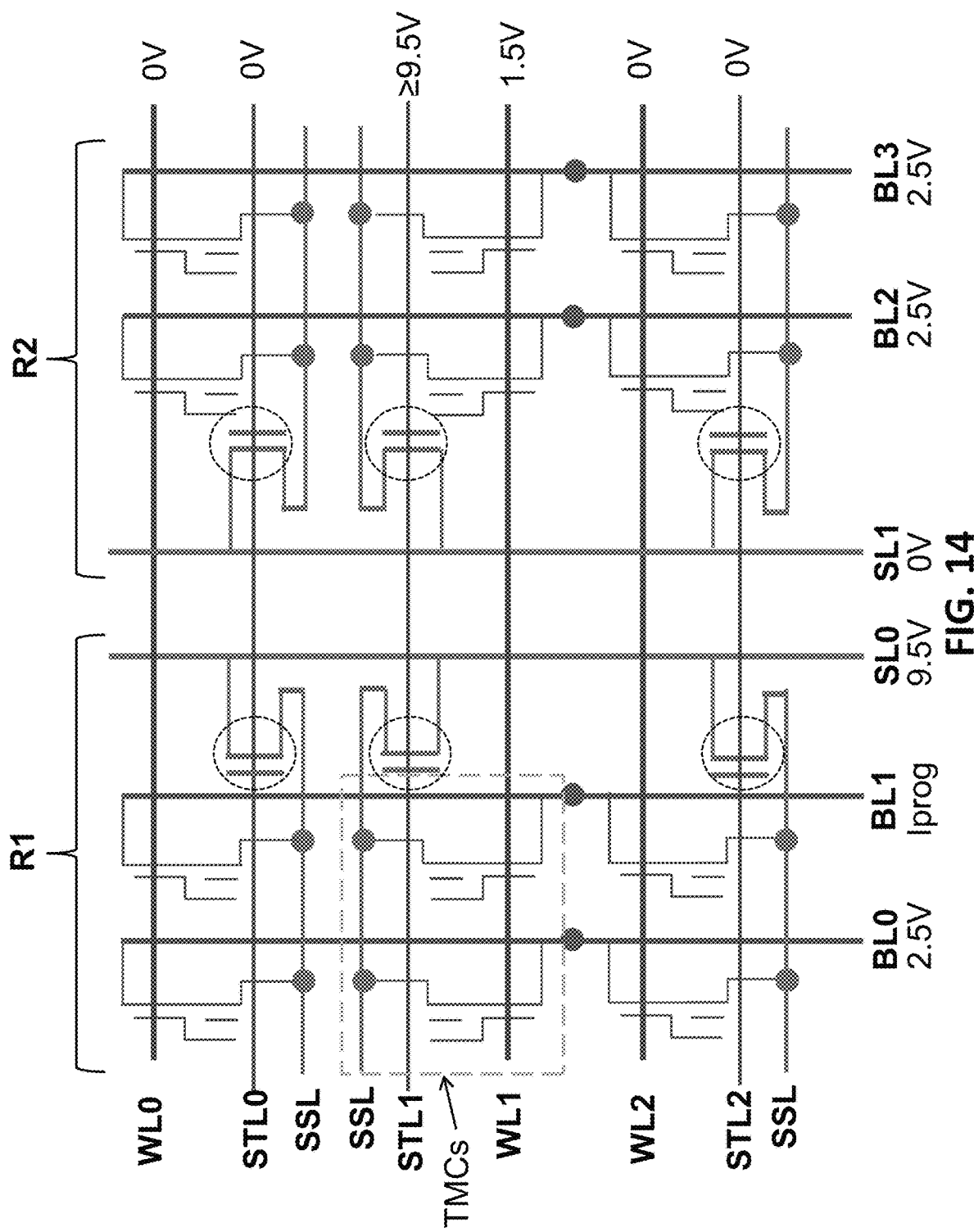
FIG. 14 is a diagram showing exemplary program operation voltages for the third embodiment of a memory array architecture.
Figure 15:
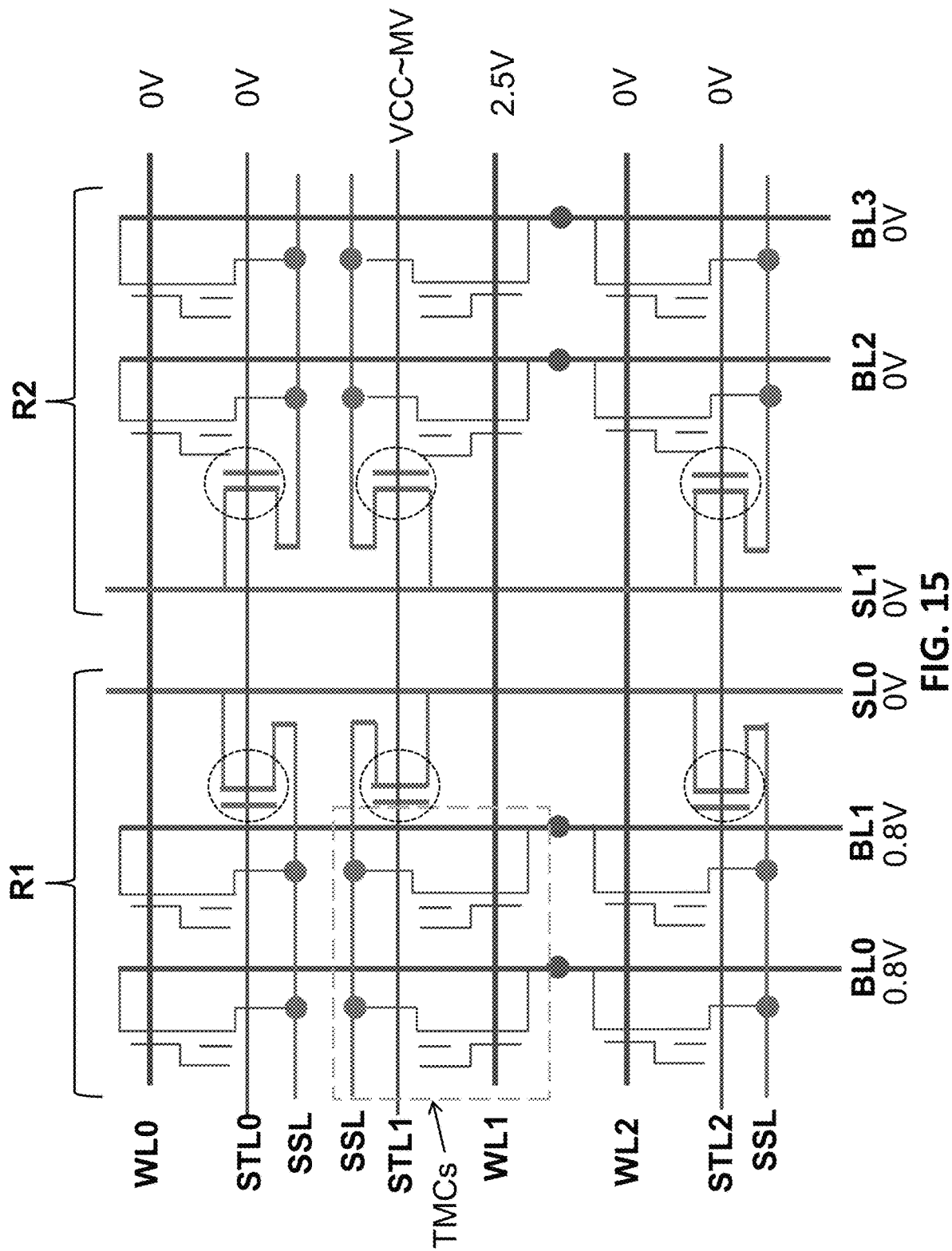
FIG. 15 is a diagram showing exemplary read operation voltages for the third embodiment of a memory array architecture.

FIGS. 12-15 illustrate a third embodiment, which is similar to the embodiment of FIGS. 4-7, except that each mirror pair of memory cells (in the column direction) has two sub source lines SSL so that each row of memory cells has its own set of sub source lines SSL (i.e., each memory cell has its own source region and sub source line SSL without sharing with another adjacent memory cell in a different row), as shown in FIG. 12. This allows for the sub source lines for each row of memory cells to be operated independently from sub source lines in other rows. FIG. 13 illustrates exemplary voltages for erasing all the memory cells on word line WL1 in region R1 (i.e., TMCs, because only those cells are subjected to a high word line voltage without a countering positive source line voltage). FIG. 14 illustrates exemplary voltages for programming one of the memory cells (right hand cell of the TMCs), and FIG. 15 illustrates exemplary voltages for reading the target memory cells TMCs.

Figure 16:
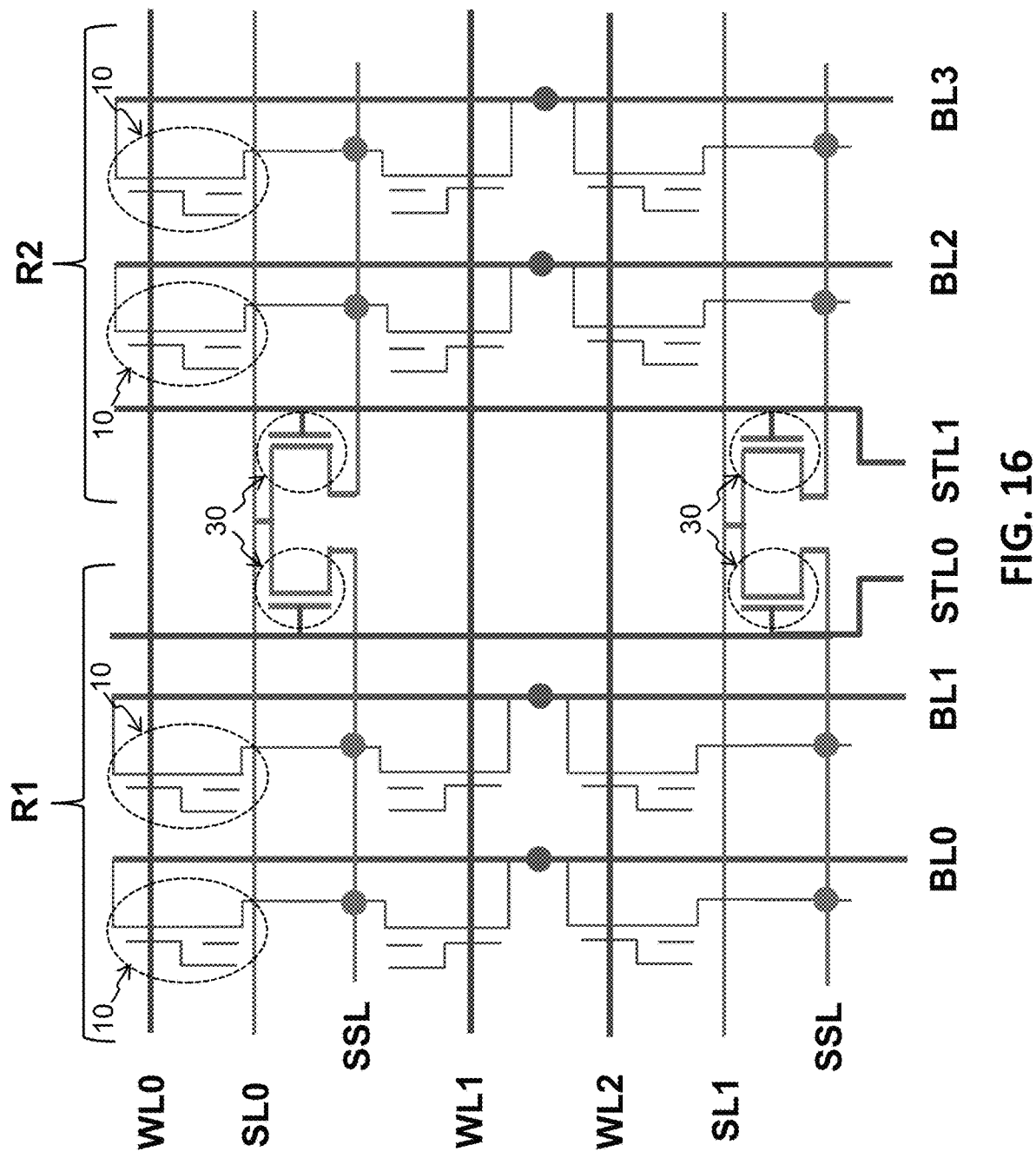
FIG. 16 is a diagram showing a fourth embodiment of a memory array architecture.
Figure 17:
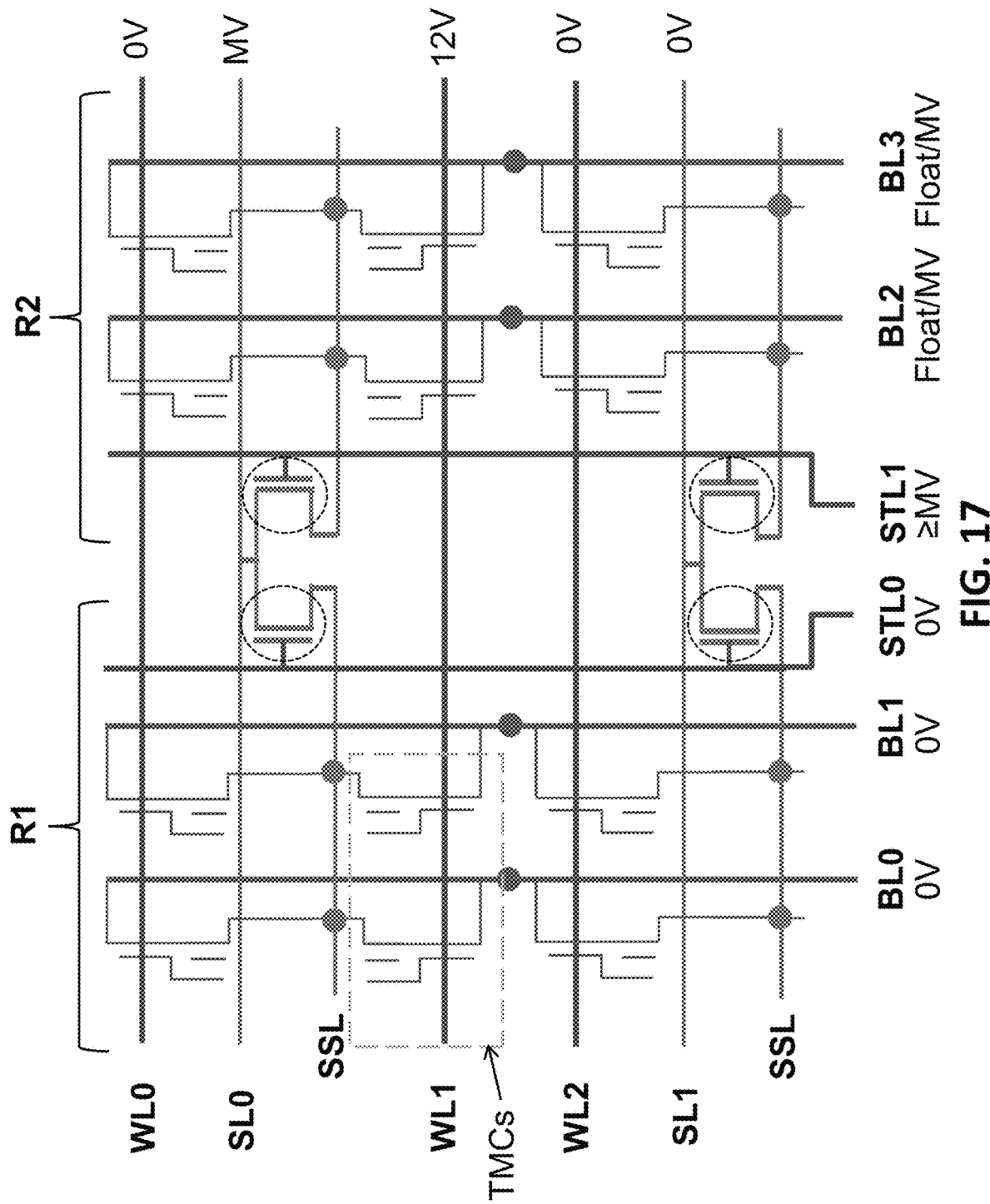
FIG. 17 is a diagram showing exemplary erase operation voltages for the fourth embodiment of a memory array architecture.
Figure 18:
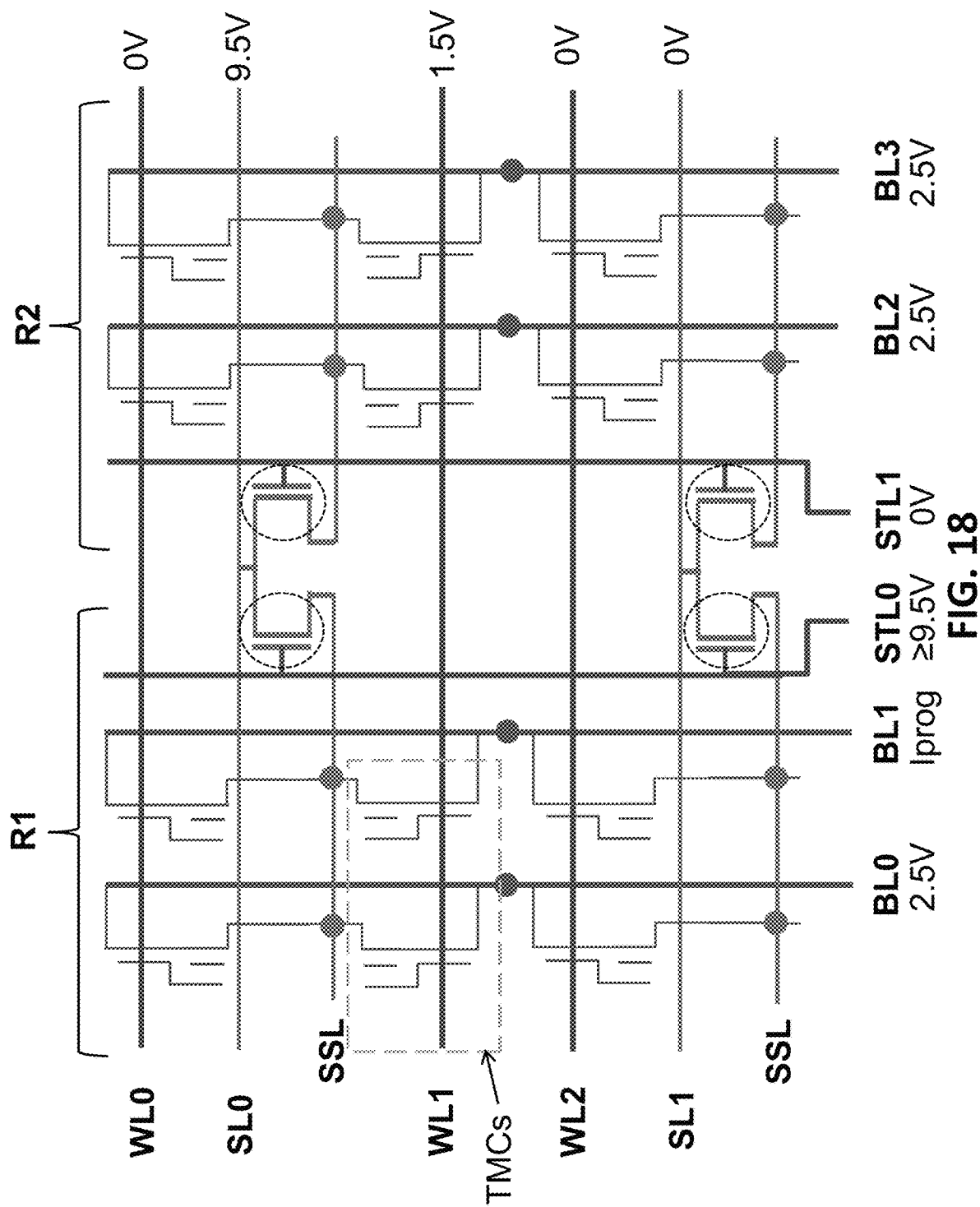
FIG. 18 is a diagram showing exemplary program operation voltages for the fourth embodiment of a memory array architecture.
Figure 19:
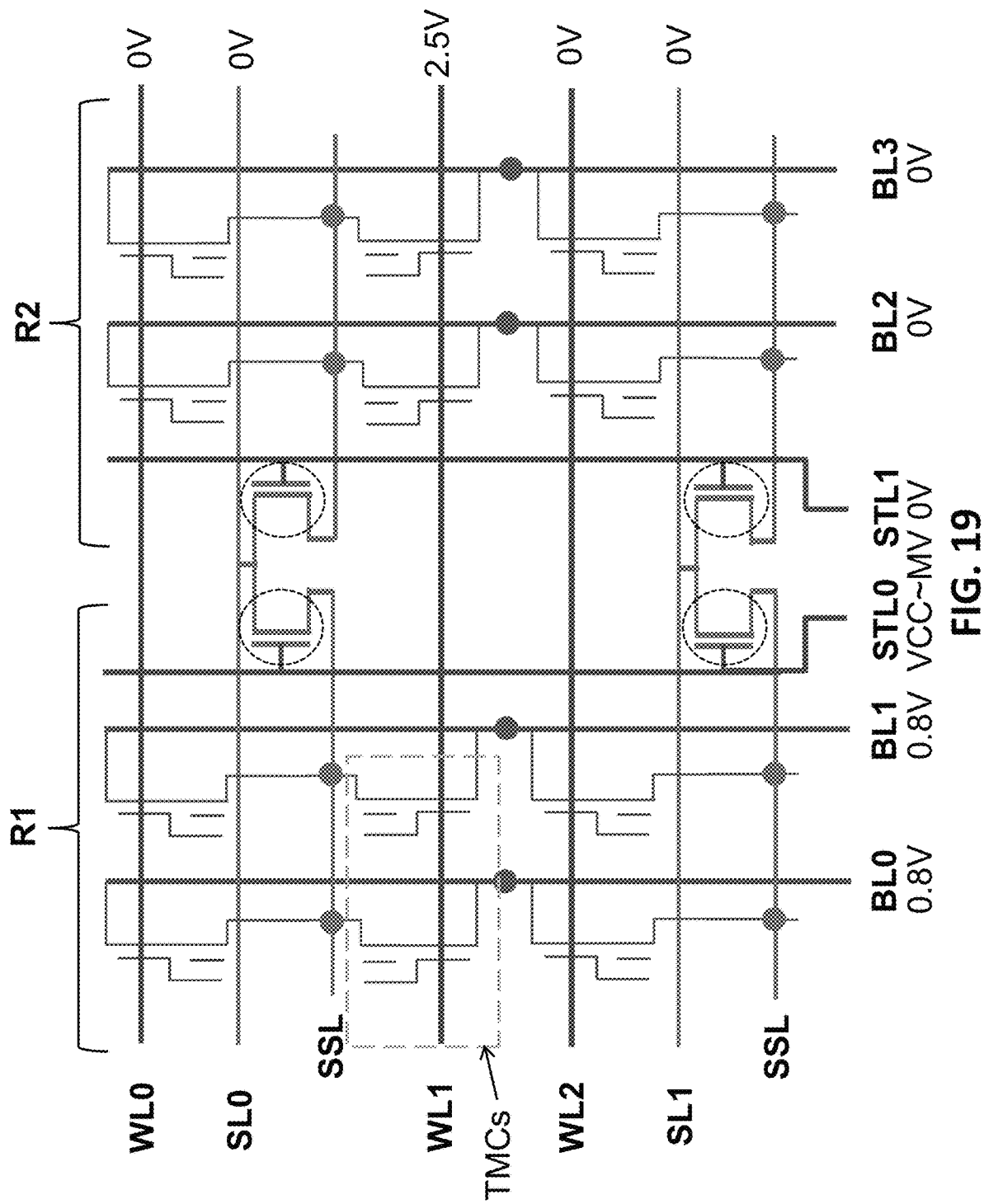
FIG. 19 is a diagram showing exemplary read operation voltages for the fourth embodiment of a memory array architecture.

FIGS. 16-19 illustrate a fourth embodiment, which is similar to the embodiment of FIGS. 4-7, except the source lines SL extend horizontally (in the row direction, each connected to a row of sub source lines SSL by the select transistors 30) and the select transistor lines STL extend vertically (in the column direction, each connected to a column of select transistors 30), so that each select transistor line STL activates a column of the select transistors instead of a row of select transistors, as shown in FIG. 16. This architecture allows for the merging of diffusion for adjacent select transistors, further reducing memory array area size. FIG. 17 illustrates exemplary voltages for erasing all the memory cells on word line WL1 in region R1 (i.e., TMCs, because only those cells are subjected to a high word line voltage without a countering positive source line voltage). FIG. 18 illustrates exemplary voltages for programming one of the memory cells (right hand cell of the TMCs), and FIG. 19 illustrates exemplary voltages for reading the target memory cells TMCs.

Figure 20:
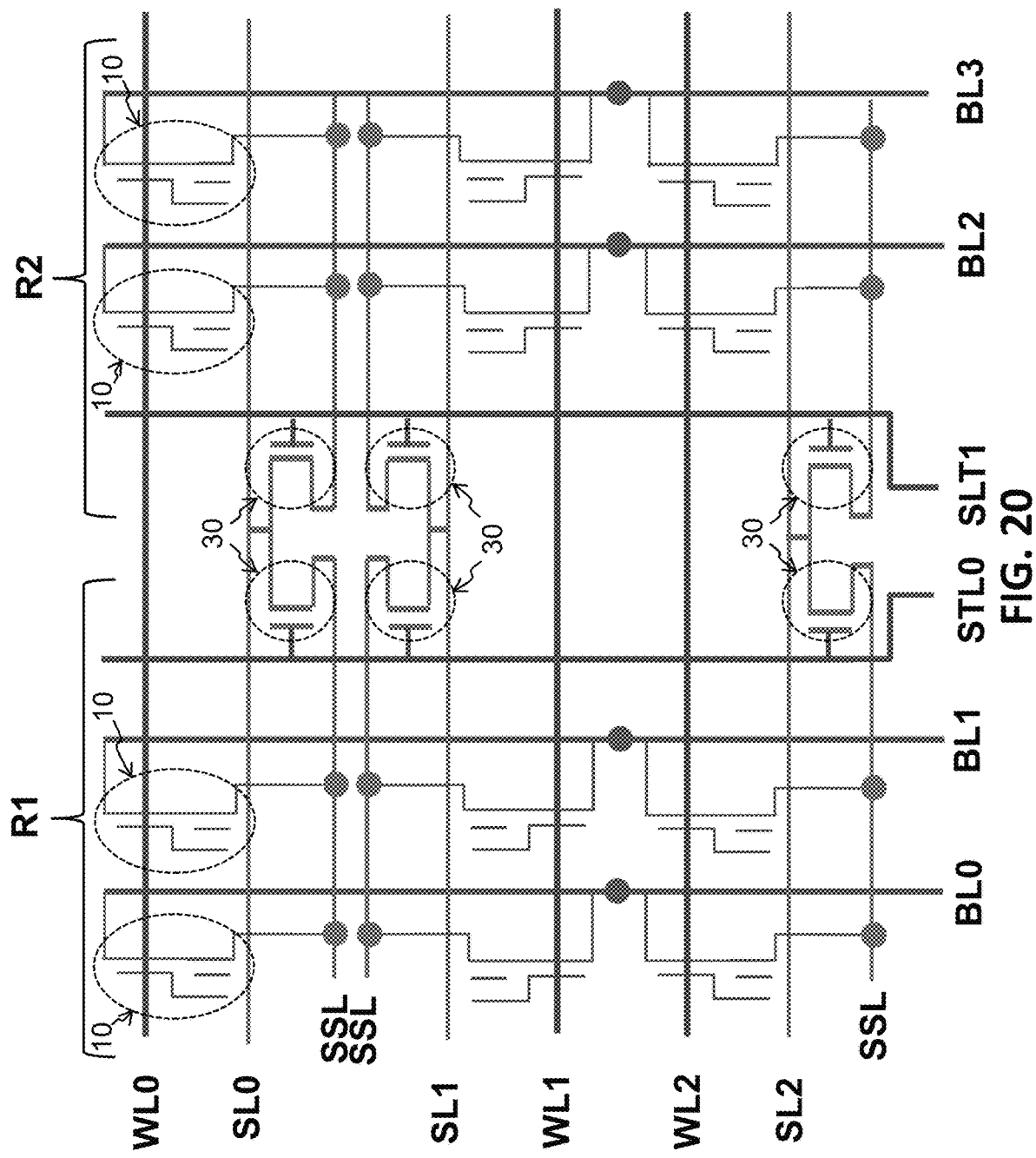
FIG. 20 is a diagram showing a fifth embodiment of a memory array architecture.
Figure 21:
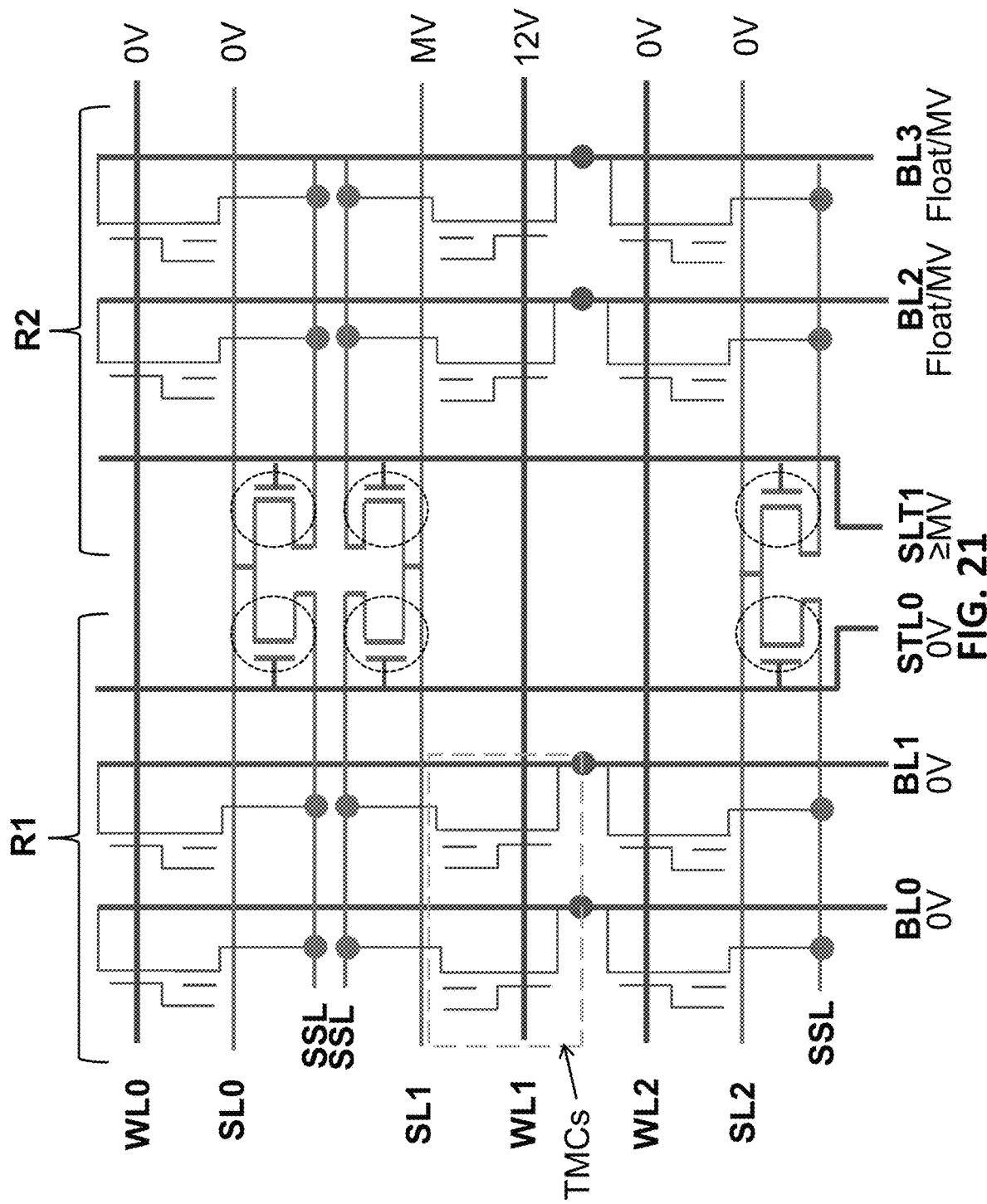
FIG. 21 is a diagram showing exemplary erase operation voltages for the fifth embodiment of a memory array architecture.
Figure 22:
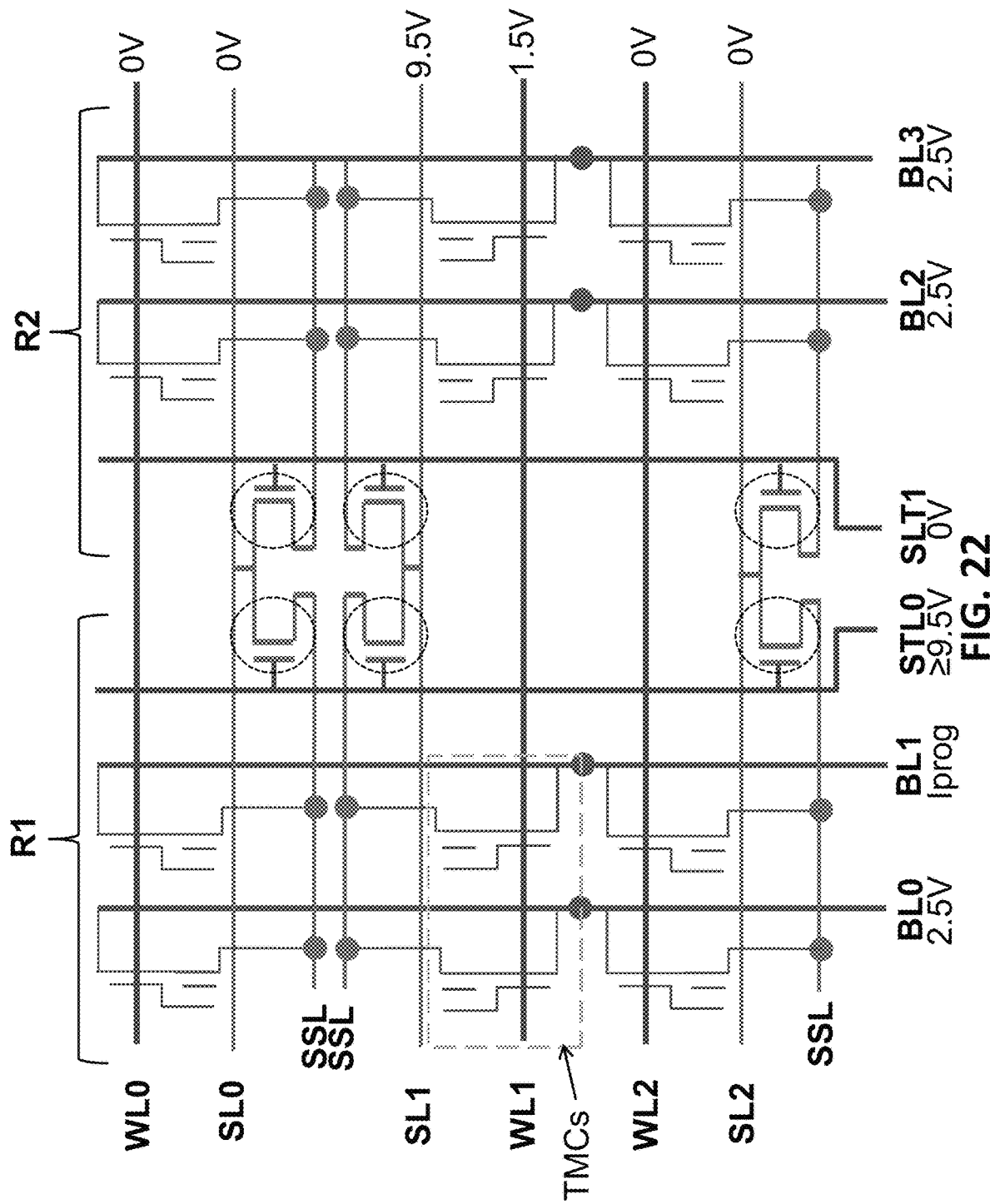
FIG. 22 is a diagram showing exemplary program operation voltages for the fifth embodiment of a memory array architecture.
Figure 23:
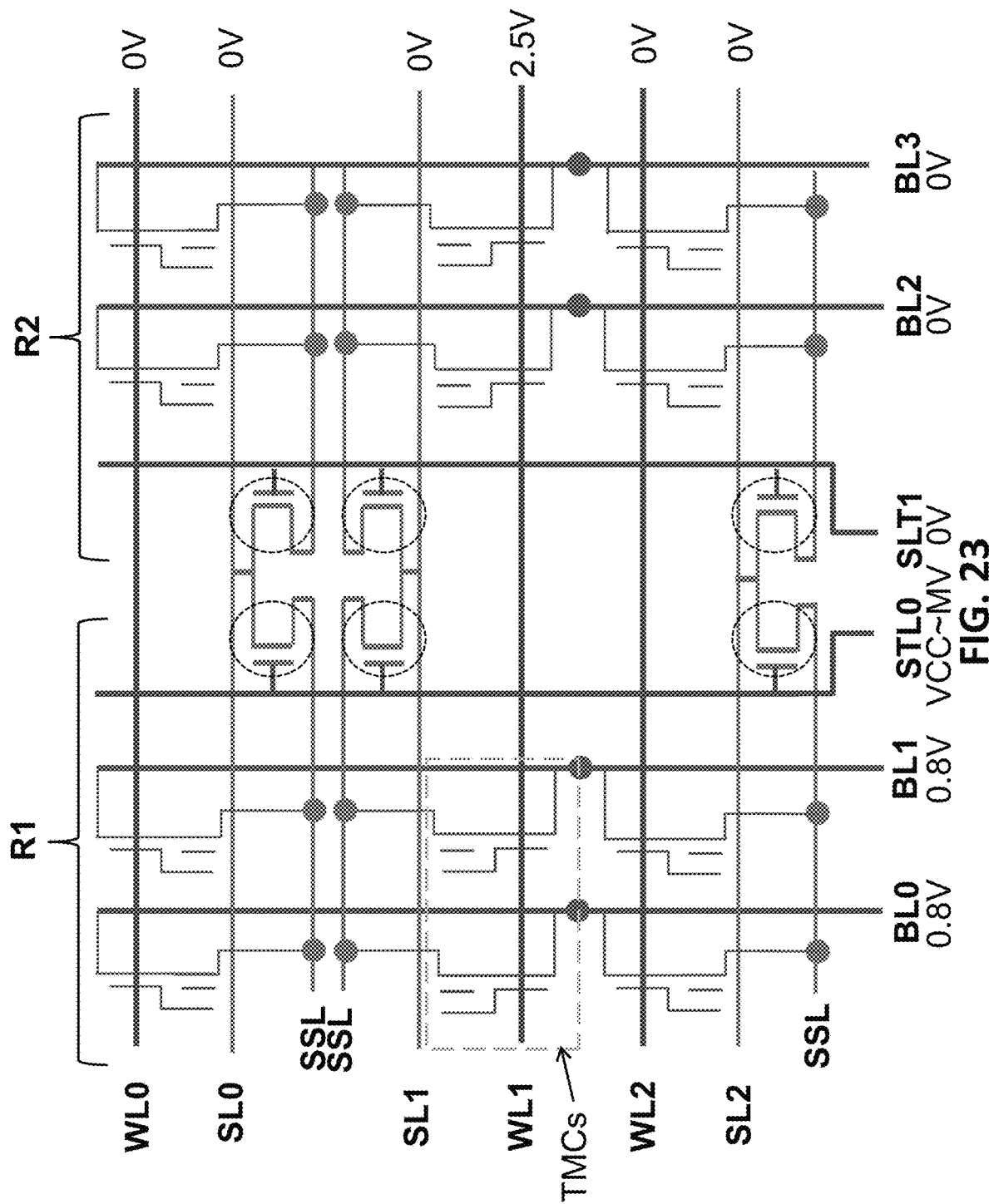
FIG. 23 is a diagram showing exemplary read operation voltages for the fifth embodiment of a memory array architecture.

FIGS. 20-23 illustrate a fifth embodiment, which is similar to the embodiment of FIGS. 4-7, except the source lines SL extend horizontally (in the row direction, each connected to a row of sub source lines SSL by the select transistors 30) and the select transistor lines STL extend vertically (in the column direction, each connected to a column of select transistors 30), so that each STL line activates a column of the select transistors instead of a row of select transistors, and each row of memory cells has its own sub source line SSLs, as shown in FIG. 20. This architecture combines features and advantages of the second and third alternate embodiments. FIG. 21 illustrates exemplary voltages for erasing all the memory cells on word line WL1 in region R1 (i.e., TMCs, because only those cells are subjected to a high word line voltage without a countering positive source line voltage). FIG. 22 illustrates exemplary voltages for programming one of the memory cells (right hand cell of the TMCs), and FIG. 23 illustrates exemplary voltages for reading the target memory cells TMCs.

Figure 24:
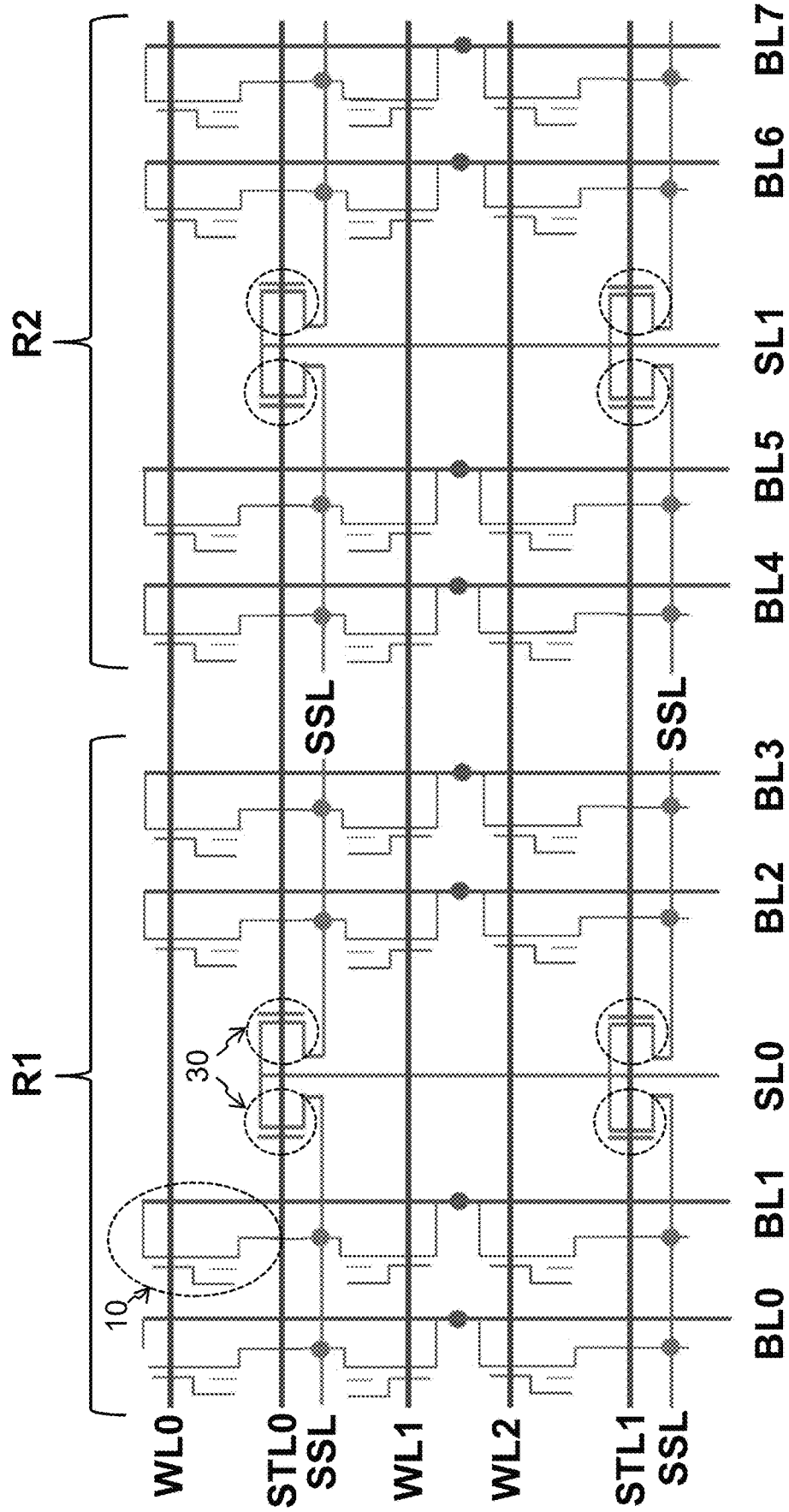
FIG. 24 is a diagram showing a sixth embodiment of a memory array architecture.
Figure 25:
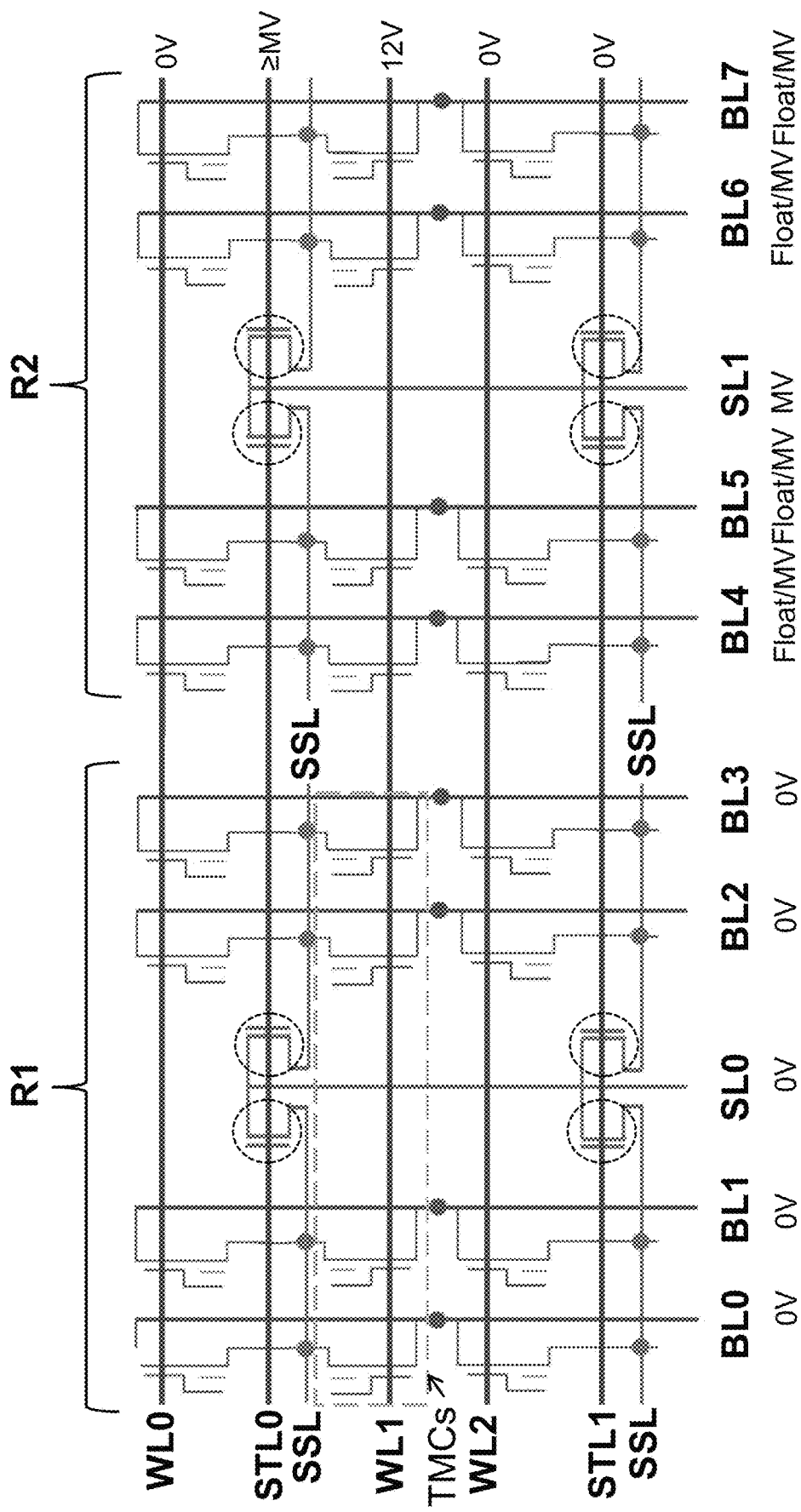
FIG. 25 is a diagram showing exemplary erase operation voltages for the sixth embodiment of a memory array architecture.
Figure 26:
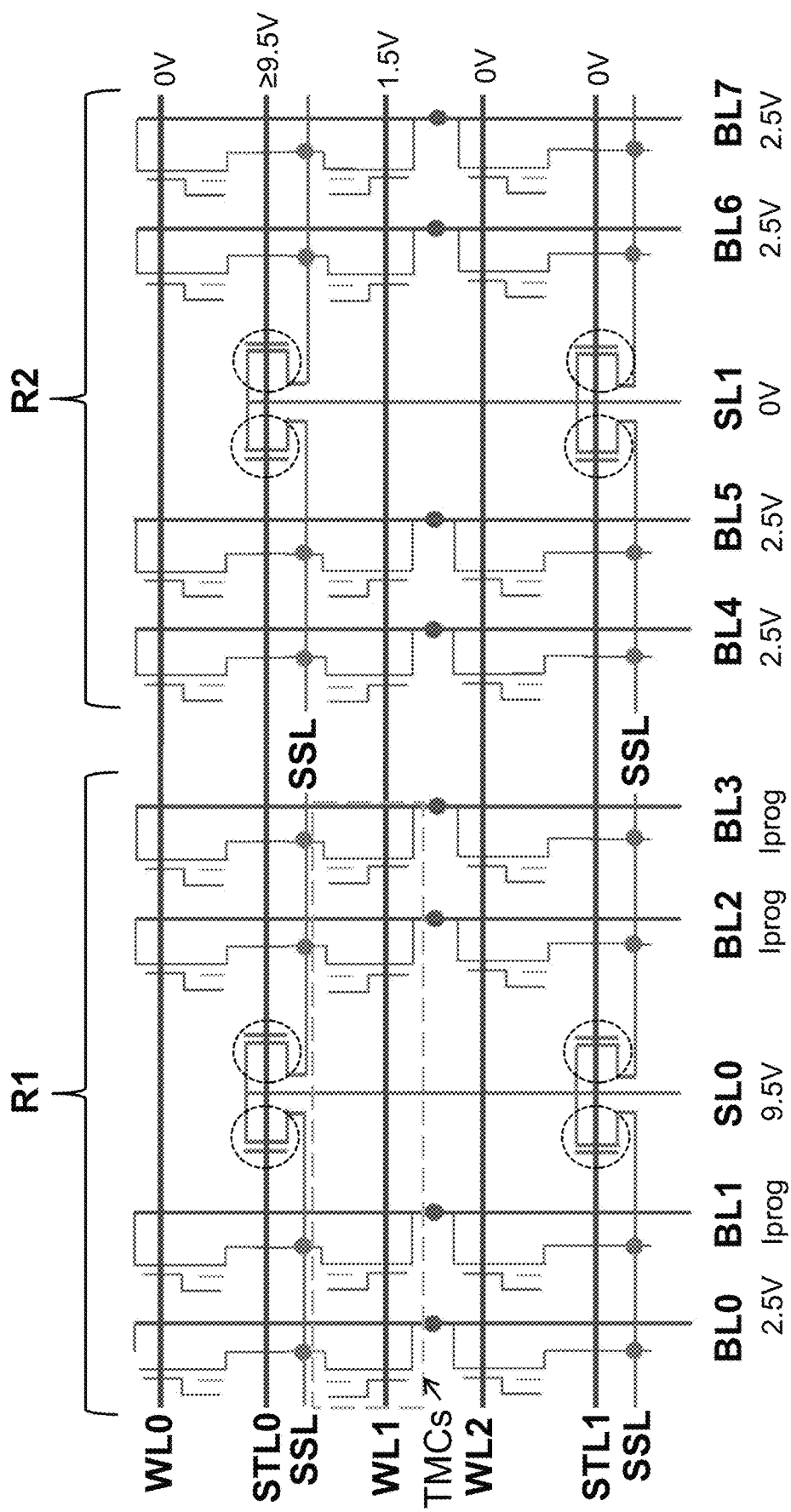
FIG. 26 is a diagram showing exemplary program operation voltages for the sixth embodiment of a memory array architecture.
Figure 27:
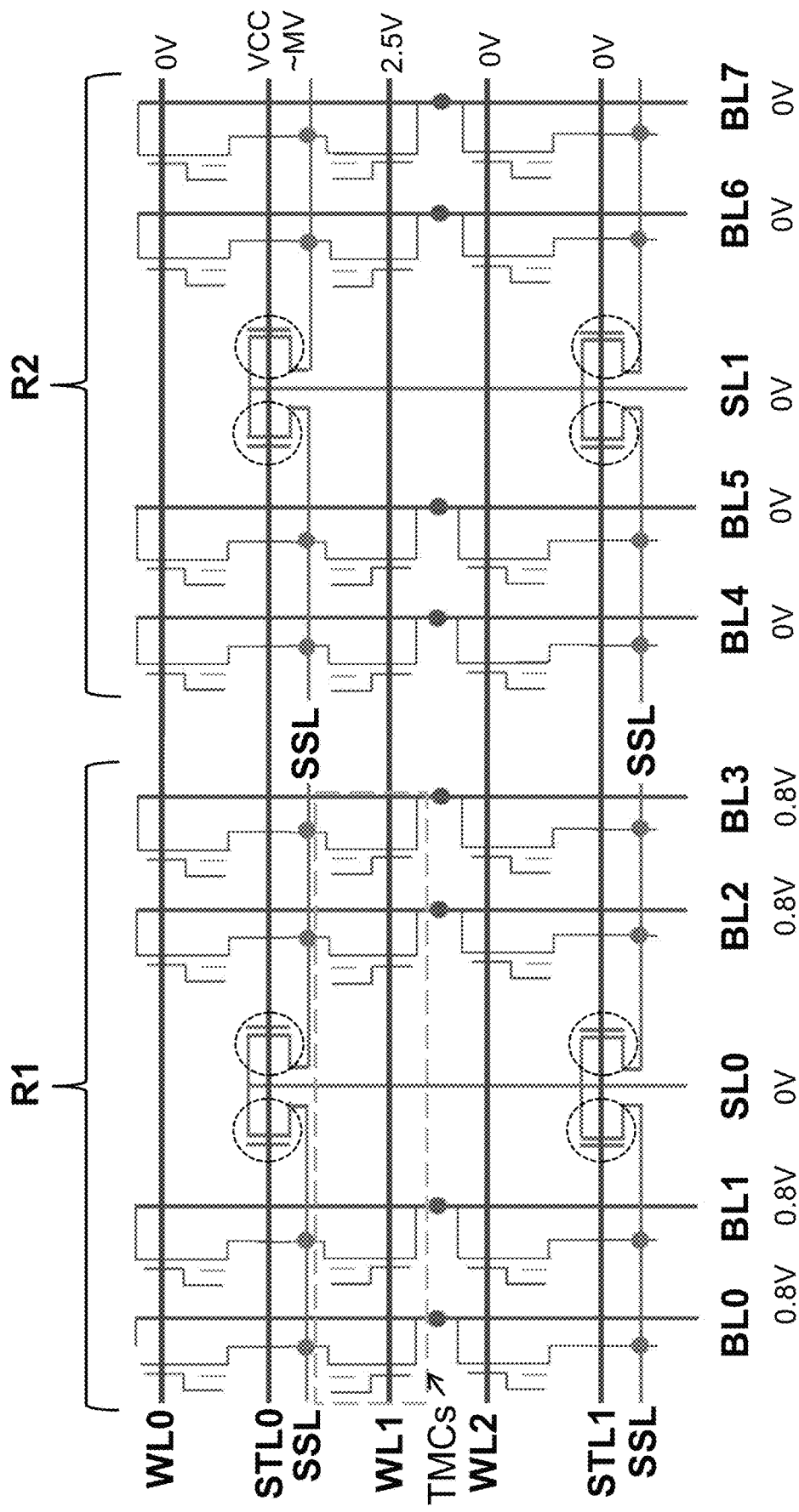
FIG. 27 is a diagram showing exemplary read operation voltages for the sixth embodiment of a memory array architecture.

FIGS. 24-27 illustrate a sixth embodiment, which is similar to the embodiment of FIGS. 4-7, except each region R includes two sub source lines SSL for each row and two select transistors 30 connected thereto (each of which coupling the sub source line SSL to the same source line SL), as shown in FIG. 24. This configuration is advantageous because each select transistor drives a sub source line that is connected to only half of the memory cell pairs in that row, reducing the load for each select transistor. FIG. 25 illustrates exemplary voltages for erasing all the memory cells on word line WL1 in region R1 (i.e., TMCs, because only those cells are subjected to a high word line voltage without a countering positive source line voltage). FIG. 26 illustrates exemplary voltages for programming one of the memory cells (left hand cell of the TMCs), and FIG. 27 illustrates exemplary voltages for reading the target memory cells TMCs.

Figure 28:
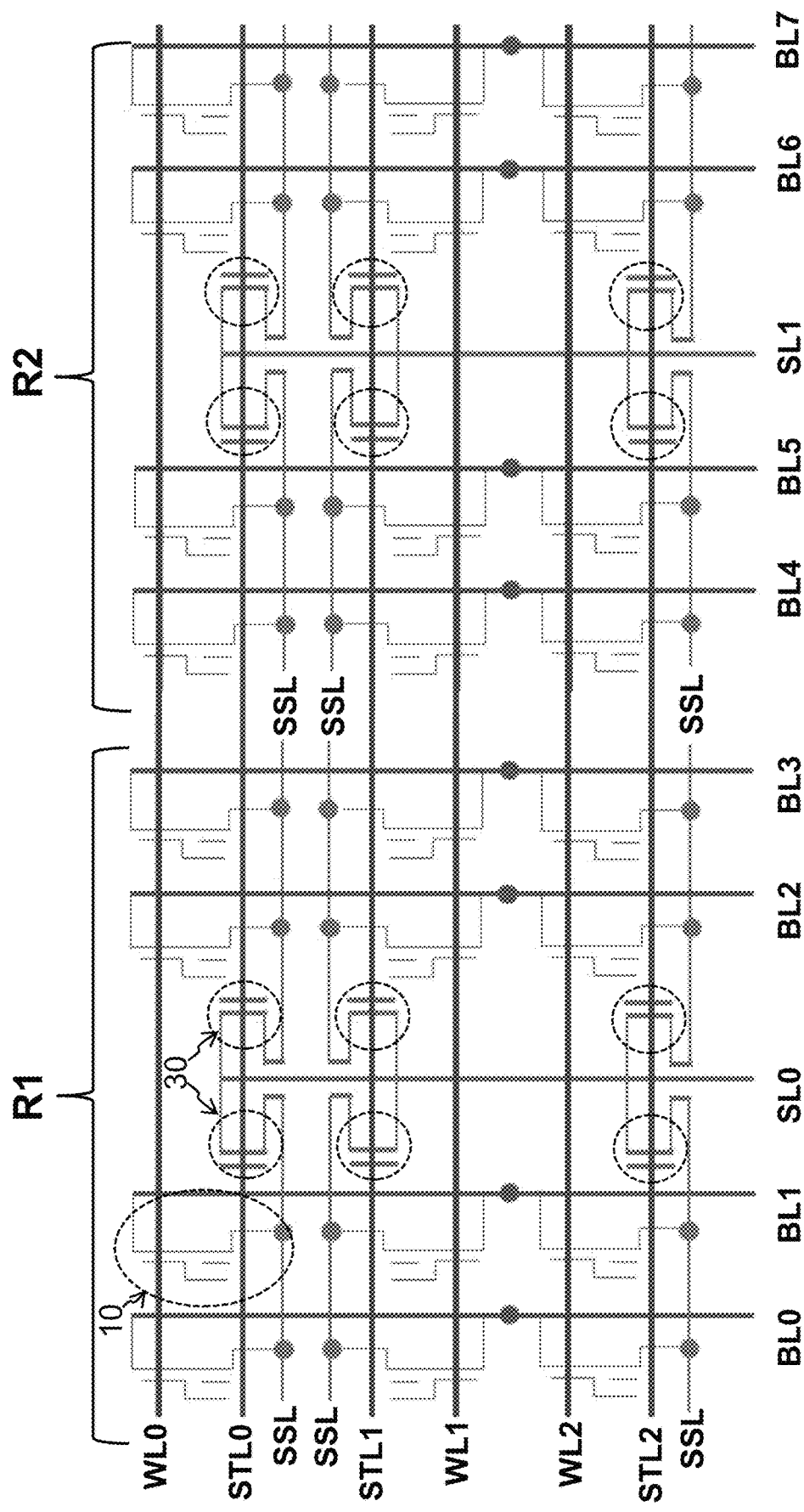
FIG. 28 is a diagram showing a seventh embodiment of a memory array architecture.
Figure 29:
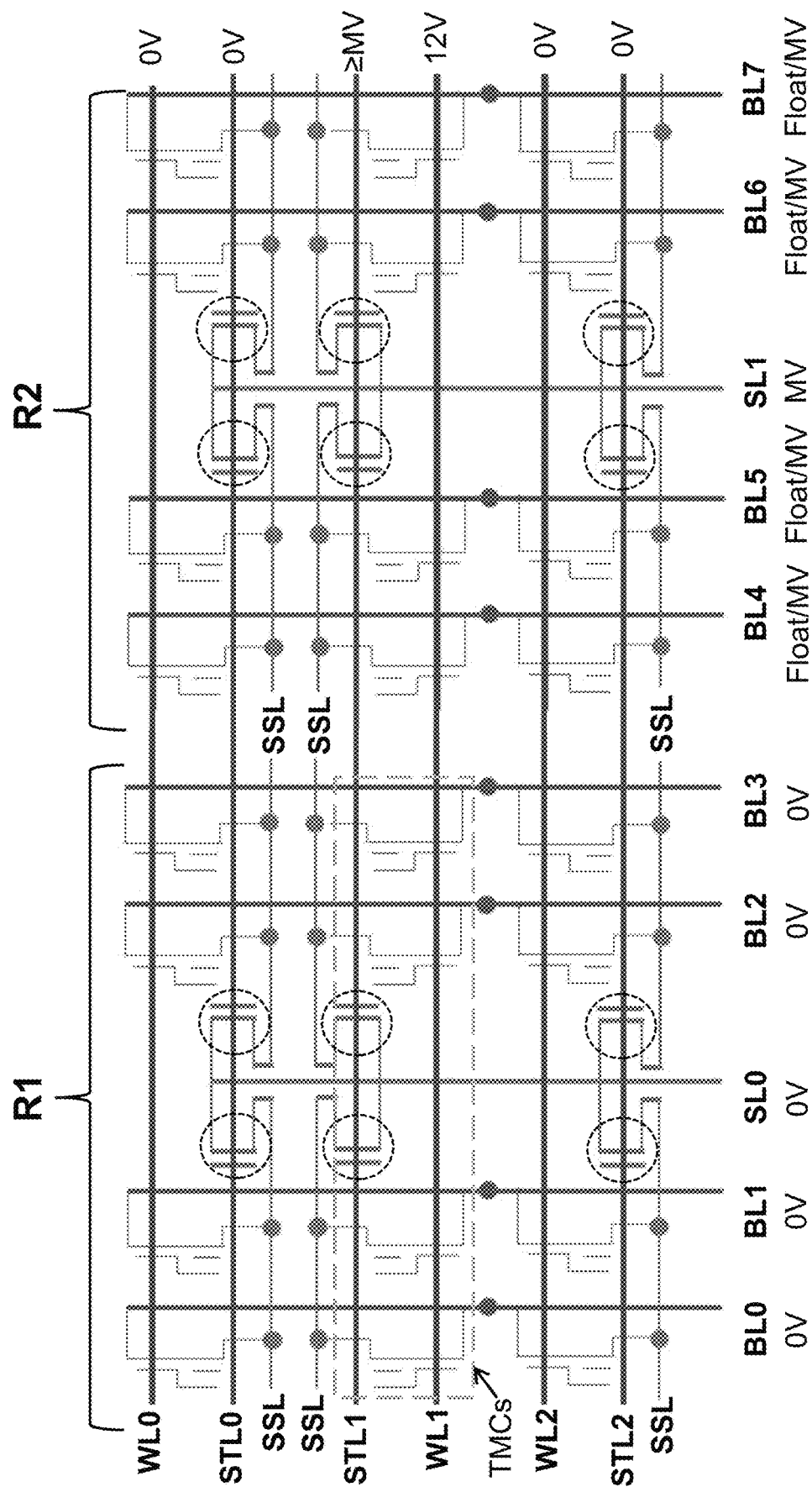
FIG. 29 is a diagram showing exemplary erase operation voltages for the seventh embodiment of a memory array architecture.
Figure 30:
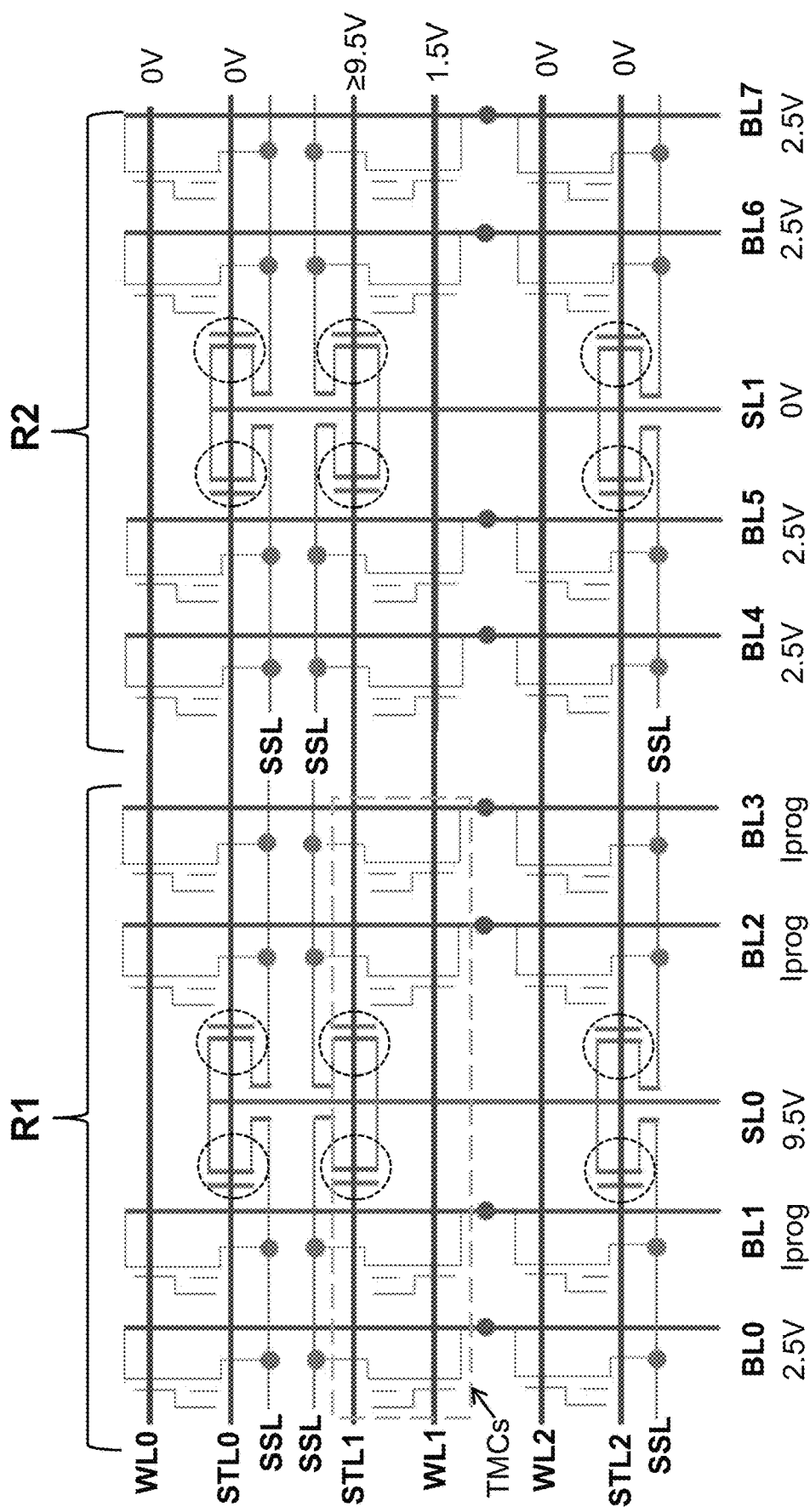
FIG. 30 is a diagram showing exemplary program operation voltages for the seventh embodiment of a memory array architecture.
Figure 31:
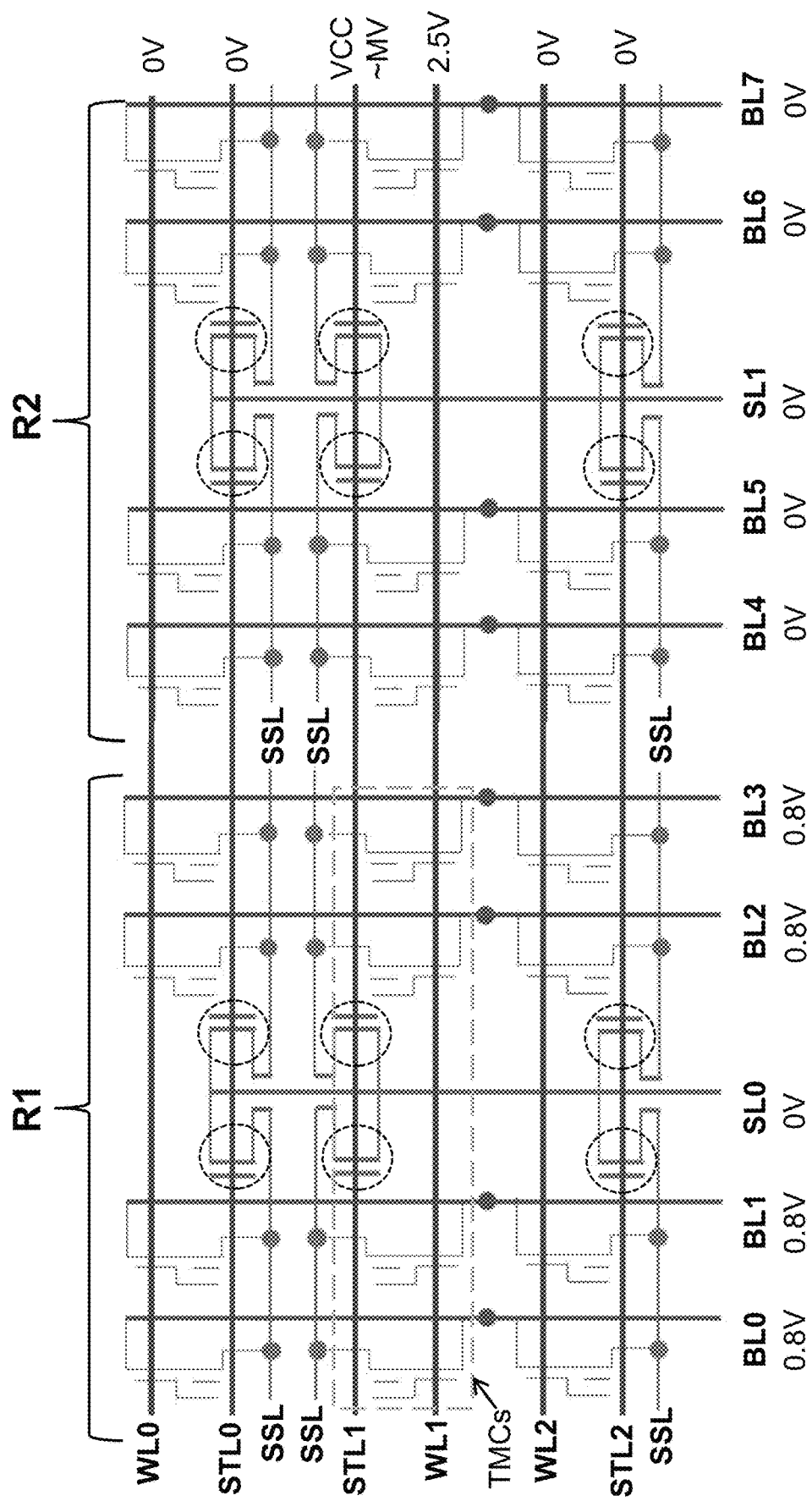
FIG. 31 is a diagram showing exemplary read operation voltages for the seventh embodiment of a memory array architecture.

FIGS. 28-31 illustrate a seventh embodiment, which is similar to the embodiment of FIGS. 4-7, except that each mirror pair of memory cells (in the column direction) has two sub source lines SSL so that each row of memory cells has its own set of sub source lines SSL (i.e., each memory cell has its own source region and sub source line SSL without sharing with another adjacent memory cell in a different row), and each region R includes two sub source lines SSL for each row and two select transistors 30 connected thereto (each of which coupling the sub source line SSL to the same source line SL), as shown in FIG. 28. This configuration combines the advantages of the third and sixth embodiments. FIG. 29 illustrates exemplary voltages for erasing all the memory cells on word line WL1 in region R1 (i.e., TMCs, because only those cells are subjected to a high word line voltage without a countering positive source line voltage). FIG. 30 illustrates exemplary voltages for programming one of the memory cells (left hand cell of the TMCs), and FIG. 31 illustrates exemplary voltages for reading the target memory cells TMCs.

Figure 1:
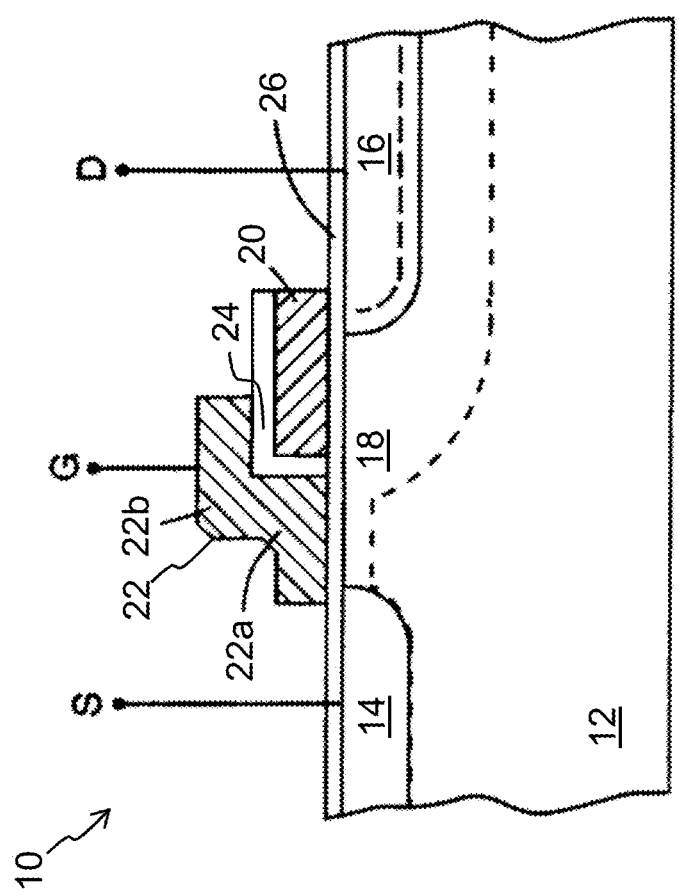
FIG. 1 is a cross sectional view of a conventional memory cell.
Figure 2:
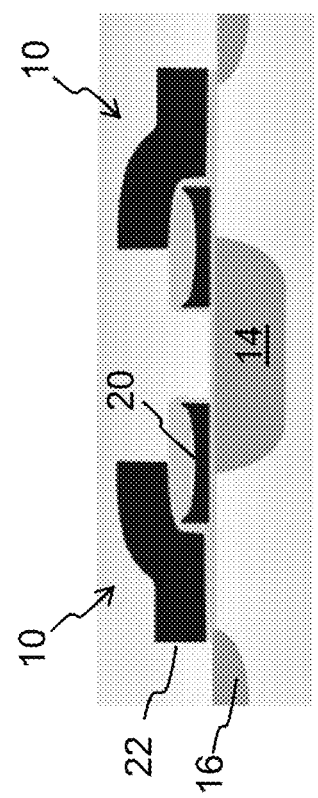
FIG. 2 is a cross sectional view of a conventional memory cell.
Figure 32:
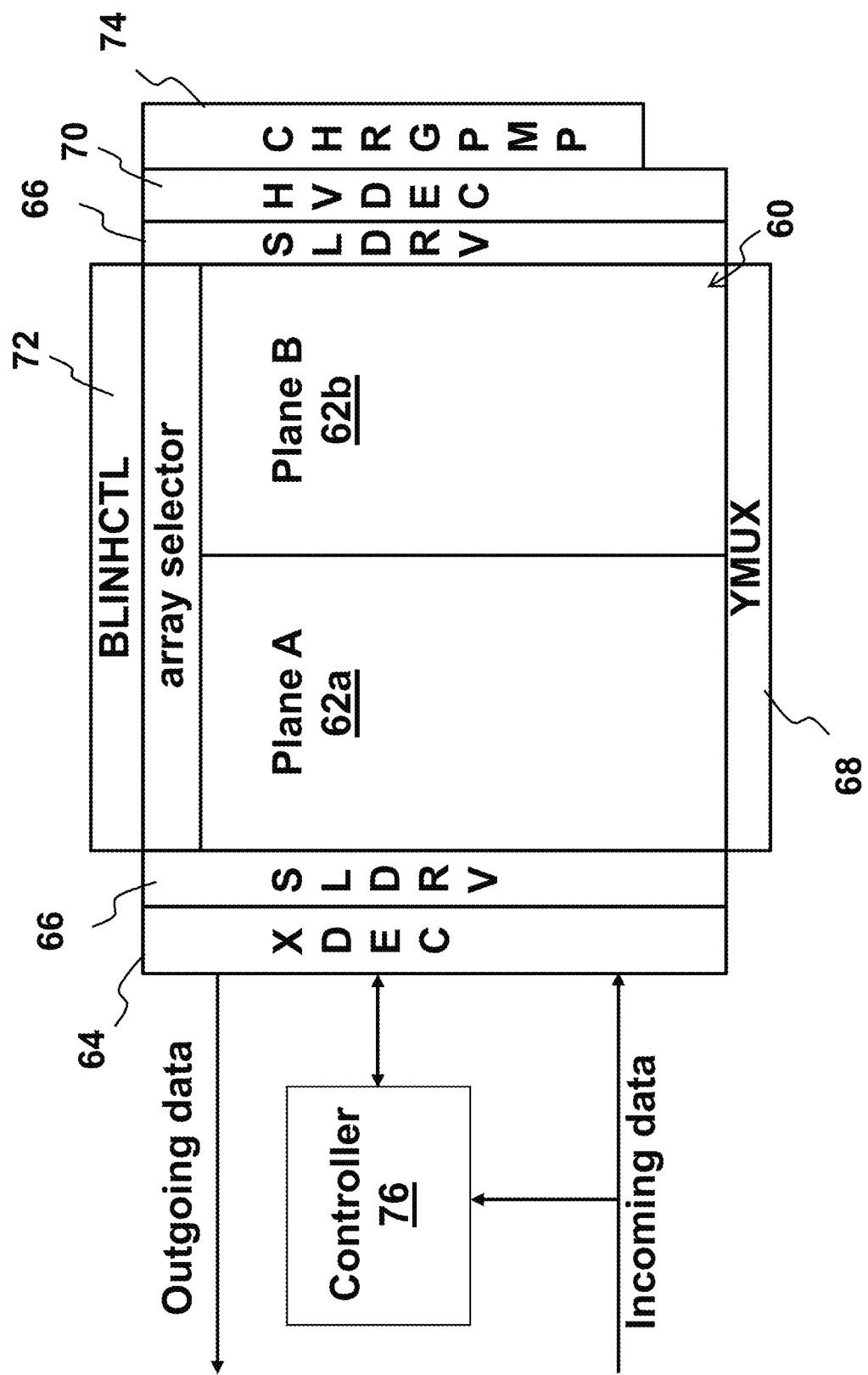
FIG. 32 is a diagram showing the architecture of an exemplary memory device.

The architecture of an exemplary memory device is illustrated in FIG. 32. The memory device includes an array 60 of non-volatile memory cells, which can be segregated into two separate planes (Plane A 62a and Plane B 62b). The memory cells can be of the type shown in FIGS. 1-2, formed on a single chip, arranged in a plurality of rows and columns in the semiconductor substrate 12 as depicted in FIGS. 4-27. Adjacent to the array of non-volatile memory cells are peripheral circuits such as address decoders, line drivers, etc. For example, XDEC 64 is a row decoder for driving the word lines. SLDRV 66 is a source line driver for driving the source lines. YMUX 68 and BLINHCTL 72 drive the bit lines and sense voltages or currents on the bit lines. HVDEC 70 is a high voltage decoder. Charge pump CHRGPMP 74 provides the various voltages used to read, program and erase the memory cells. These peripheral circuit components are used to decode addresses and supply the various voltages to the various memory cell gates, lines and regions during read, program, and erase operations. Controller 76 (containing control circuitry) controls the various device elements to implement each operation (program, erase, read) on target memory cells, including the peripheral circuits mentioned above as well as the select transistors 30 inside the memory array, to provide the signals on the various lines including the select transistor lines STL.

For all the above described embodiments, the total size of the array is only moderately increased (to make room for the select transistors and their lines), which is a worthwhile tradeoff for being able to erase only a sub row of memory cells at any given time, and selectively apply voltages only on certain sub source lines SSL during operation to increase performance. Moreover, the select transistors can be added to the memory array without otherwise materially changing the remaining portions of the memory array and the process flow in forming it.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Further, as is apparent from the claims and specification, not all method steps need be performed in the exact order illustrated or claimed, but rather in any order that allows the proper formation of the memory device of the present invention. Single layers of material could be formed as multiple layers of such or similar materials, and vice versa. Materials, processes and numerical examples described above are exemplary only, and should not be deemed to limit the claims. For example, applying a 0V is the same as applying no voltage or grounding the line where the result is zero volts on the particular line. Additionally, while many of the applied voltages are indicated as 0V, applying a low positive or negative voltage for one or more of the indicated lines can produce the same desired results for programming, reading and erasing the memory cells. Finally, the numerical values disclosed above and in the figures can vary depending on the performance variations of the manufactured memory cell array. For example, the following table summarizes non-limiting exemplary ranges of voltages and currents applied to selected lines and unselected lines for the above described embodiments:

TABLE 1

| Operation | WL | WL unselect | BL | BL unselect | SL | SL unselect | STL | STL unselect |
|---|---|---|---|---|---|---|---|---|
| Erase (FIGS. 5/9/13/25/29) | ~11-13 V | 0 V | 0 V | MV (~6-9 V)/Float | 0 V | MV (~6-9 V) | ≥MV | 0 V |
| Erase (FIGS. 17/21) | ~11-13 V | 0 V | 0 V | MV (~6-9 V)/Float | MV (~6-9 V) | 0 V | 0 V | ≥MV |
| Program (FIGS. 6/10/14/18/22/26/30) | ~Vth-2 V | 0 V | Iprog (~1-5ua) | Vinh (~2-3 V)* | Vslp (~9-10 V) | 0 V | ≥Vslp | 0 V |
| Read (FIGS. 7/11/15/19/23/27/31) | ~1.5-3 V | 0 V | ~0.6-2 V | 0 V | 0 V | 0 V | VCC~MV | 0 V |

*It may be desirable to place 0 V on the unselected bit lines in the region R not containing the target memory cell during programming.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory device, comprising:
   a plurality of memory cells configured in rows and columns on a semiconductor substrate, wherein each of the memory cells includes:
      source and drain regions formed in the substrate and defining a channel region of the substrate extending there between,
      a floating gate disposed over and insulated from a first portion of the channel region,
      a control gate disposed over and insulated from a second portion of the channel region;
   a plurality of word lines each electrically connecting together all of the control gates for one of the rows of the memory cells;
   a plurality of bit lines each electrically connecting together the drain regions for one of the columns of the memory cells;
   a plurality of first sub source lines each electrically connecting together the source regions of the memory cells that are in one of the rows of the memory cells and are in a first plurality of the columns of the memory cells;
   a plurality of second sub source lines each electrically connecting together the source regions of the memory cells that are in one of the rows of the memory cells and are in a second plurality of the columns of the memory cells, wherein the first plurality of the columns is different from the second plurality of the columns;
   a first source line and a second source line;
   a plurality of first select transistors each connected between one of the first sub source lines and the first source line;
   a plurality of second select transistors each connected between one of the second sub source lines and the second source line;
   a plurality of select transistor lines each connected to a gate of one of the first select transistors and a gate of one of the second select transistors.

2. The memory device of claim 1, wherein for each of the select transistor lines, the one of the first select transistors and the one of the second select transistors are connected to the sub source lines for a same row of the memory cells.

3. The memory device of claim 1, further comprising:
   a controller configured to perform an erase operation on a target group of the memory cells which are in the first plurality of columns of the memory cells, are connected to a first of the sub source lines, and are connected to a first of the word lines, by:
      applying a positive voltage to the first word line;
      applying a positive voltage to a first of the select transistor lines which is connected to the gate of the select transistor that is connected between the second source line and a second of the sub source lines for memory cells which are in the second plurality of columns of the memory cells and are connected to the first word line; and
      applying a positive voltage to the second source line.

4. The memory device of claim 3, wherein the controller is configured to perform the erase operation further by applying a voltage below a threshold voltage of the first and second select transistors to the plurality of select transistor lines except for the first of the select transistor lines.

5. The memory device of claim 1, wherein:
   each of the first sub source lines electrically connects together the source regions of the memory cells that are in a second one of the rows of the memory cells and that are in the first plurality of the columns of the memory cells; and each of the second sub source lines electrically connects together the source regions of the memory cells that are in a second one of the rows of the memory cells and that are in the second plurality of the columns of the memory cells.

6. A memory device, comprising:
a plurality of memory cells configured in rows and columns on a semiconductor substrate, wherein each of the memory cells includes:
  source and drain regions formed in the substrate and defining a channel region of the substrate extending there between,
  a floating gate disposed over and insulated from a first portion of the channel region,
  a control gate disposed over and insulated from a second portion of the channel region;
a plurality of word lines each electrically connecting together all of the control gates for one of the rows of the memory cells;
a plurality of bit lines each electrically connecting together the drain regions for one of the columns of the memory cells;
a plurality of first sub source lines each electrically connecting together the source regions of the memory cells that are in one of the rows of the memory cells and are in a first plurality of the columns of the memory cells;
a plurality of second sub source lines each electrically connecting together the source regions of the memory cells that are in one of the rows of the memory cells and are in a second plurality of the columns of the memory cells, wherein the first plurality of the columns is different from the second plurality of the columns;
a first source line and a second source line;
a plurality of first select transistors each connected between one of the first sub source lines and the first source line;
a plurality of second select transistors each connected between one of the second sub source lines and the second source line;
a plurality of select transistor lines each connected to a gate of one of the first select transistors and a gate of one of the second select transistors;
a plurality of third select transistors each connected between one of first sub source lines and the first source line;
a plurality of fourth select transistors each connected between one of second sub source lines and the second source line.

7. The memory device of claim 1, wherein:
for each one of the first sub source lines, all of the source regions electrically connected together by the one first sub source line are for memory cells in only one of the rows of the memory cells; and
for each one of the second sub source lines, all of the source regions electrically connected together by the one second sub source line are for memory cells in only one of the rows of the memory cells.

8. The memory device of claim 1, further comprising:
a plurality of third sub source lines each electrically connecting together the source regions of the memory cells that are in one of the rows of the memory cells and are in a third plurality of the columns of the memory cells;
a plurality of fourth sub source lines each electrically connecting together the source regions of the memory cells that are in one of the rows of the memory cells and are in a fourth plurality of the columns of the memory cells, wherein the first, second, third and fourth pluralities of the columns are different from each other;
a plurality of third select transistors each connected between one of third sub source lines and the first source line;
a plurality of fourth select transistors each connected between one of fourth sub source lines and the second source line;
wherein each of the select transistor lines is connected to a gate of one of the first select transistors and a gate of one of the second select transistors and a gate of one of the third select transistors and a gate of one of the fourth select transistors.

9. The memory device of claim 1, further comprising:
a plurality of third sub source lines each electrically connecting together the source regions of the memory cells that are in one of the rows of the memory cells and are in a third plurality of the columns of the memory cells;
a plurality of fourth sub source lines each electrically connecting together the source regions of the memory cells that are in one of the rows of the memory cells and are in a fourth plurality of the columns of the memory cells, wherein the first, second, third and fourth pluralities of the columns are different from each other;
a plurality of third select transistors each connected between one of third sub source lines and the first source line;
a plurality of fourth select transistors each connected between one of fourth sub source lines and the second source line;
wherein each of the select transistor lines is connected to a gate of one of the first select transistors and a gate of one of the second select transistors and a gate of one of the third select transistors and a gate of one of the fourth select transistors;
wherein for each one of the first sub source lines, all of the source regions electrically connected together by the one first sub source line are for memory cells in only one of the rows of the memory cells;
wherein for each one of the second sub source lines, all of the source regions electrically connected together by the one second sub source line are for memory cells in only one of the rows of the memory cells;
wherein for each one of the third sub source lines, all of the source regions electrically connected together by the one third sub source line are for memory cells in only one of the rows of the memory cells; and
wherein for each one of the fourth sub source lines, all of the source regions electrically connected together by the one fourth sub source line are for memory cells in only one of the rows of the memory cells.

10. A memory device, comprising:
a plurality of memory cells configured in rows and columns on a semiconductor substrate, wherein each of the memory cells includes:
  source and drain regions formed in the substrate and defining a channel region of the substrate extending there between,
  a floating gate disposed over and insulated from a first portion of the channel region,
  a control gate disposed over and insulated from a second portion of the channel region;

a plurality of word lines each electrically connecting together all of the control gates for one of the rows of the memory cells;

a plurality of bit lines each electrically connecting together the drain regions for one of the columns of the memory cells;

a plurality of first sub source lines each electrically connecting together the source regions of the memory cells that are in one of the rows of the memory cells and are in a first plurality of the columns of the memory cells;

a plurality of second sub source lines each electrically connecting together the source regions of the memory cells that are in one of the rows of the memory cells and are in a second plurality of the columns of the memory cells, wherein the first plurality of the columns is different from the second plurality of the columns;

a plurality of source lines;

a plurality of first select transistors each connected between one of first sub source lines and one of the source lines;

a plurality of second select transistors each connected between one of second sub source lines and one of the source lines;

a first select transistor line connected to gates of the first select transistors; and a second select transistor line connected to gates of the second select transistors.

11. The memory device of claim 10, wherein for each of the source lines, one of the first select transistors connected thereto is connected to one of the first sub source lines for a first row of the memory cells and one of the second select transistors connected thereto is connected to one of the second sub source lines for the first row of the memory cells.

12. The memory device of claim 10, further comprising:

a controller configured to perform an erase operation on a target group of the memory cells which are in the first plurality of columns of the memory cells, are connected to a first of the sub source lines, and are connected to a first of the word lines, by:

applying a positive voltage to the first word line;

applying a positive voltage to the second select transistor line; and applying a positive voltage to one of the source lines that is connected to one of the select transistors that is connected to one of the sub source lines for memory cells which are in the second plurality of columns of the memory cells and are connected to the first word line.

13. The memory device of claim 12, wherein the controller is configured to perform the erase operation further by applying a voltage below a threshold voltage of the first and second select transistors to the first select transistor line.

14. The memory device of claim 10, wherein:

each of the first sub source lines electrically connects together the source regions of the memory cells that are in a second one of the rows of the memory cells and that are in the first plurality of the columns of the memory cells; and each of the second sub source lines electrically connects together the source regions of the memory cells that are in a second one of the rows of the memory cells and that are in the second plurality of the columns of the memory cells.

15. The memory device of claim 10, wherein:

for each one of the first sub source lines, all of the source regions electrically connected together by the one first sub source line are for memory cells in only one of the rows of the memory cells; and for each one of the second sub source lines, all of the source regions electrically connected together by the one second sub source line are for memory cells in only one of the rows of the memory cells.

\* \* \* \* \*